US011138769B2

(12) United States Patent
Nagashima et al.

(10) Patent No.: US 11,138,769 B2
(45) Date of Patent: Oct. 5, 2021

(54) IMAGE RECONSTRUCTION METHOD

(71) Applicant: CANON MEDICAL SYSTEMS CORPORATION, Otawara (JP)

(72) Inventors: Masaaki Nagashima, Sakura (JP); Hiroshi Takai, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 173 days.

(21) Appl. No.: 16/409,105

(22) Filed: May 10, 2019

(65) Prior Publication Data

US 2019/0347834 A1 Nov. 14, 2019

(30) Foreign Application Priority Data

May 11, 2018 (JP) .............................. JP2018-092339

(51) Int. Cl.
| G06T 11/00 | (2006.01) |
| G01R 33/567 | (2006.01) |
| G01R 33/561 | (2006.01) |
| G01R 33/48 | (2006.01) |
| G01R 33/563 | (2006.01) |

(52) U.S. Cl.
CPC ........ G06T 11/006 (2013.01); G01R 33/4818 (2013.01); G01R 33/561 (2013.01); G01R 33/5673 (2013.01); G06T 11/005 (2013.01)

(58) Field of Classification Search
None
See application file for complete search history.

(56) References Cited

U.S. PATENT DOCUMENTS

| 9,213,916 B2 * | 12/2015 | Gardiner ................... G06T 9/00 |
| 2009/0148021 A1 | 6/2009 | Yui |
| 2015/0160319 A1 * | 6/2015 | Choi .................. G01R 33/5611 324/309 |
| 2015/0241537 A1 * | 8/2015 | Dannels ........... G01R 33/56554 324/309 |

(Continued)

FOREIGN PATENT DOCUMENTS

| CN | 103874458 A | * | 6/2014 | .......... G01R 33/246 |
| CN | 103323805 B | * | 4/2015 | |

(Continued)

*Primary Examiner* — Mohammed Rachedine
(74) *Attorney, Agent, or Firm* — Oblon, McClelland, Maier & Neustadt, L.L.P.

(57) ABSTRACT

An image reconstruction method according to an embodiment includes: collecting first k-space data at a first time and second k-space data having an undersampled pattern different from an undersampled pattern of the first k-space data at a second time different from the first time; generating intermediate data by converting data including the first k-space data and the second k-space data; generating, by inversely converting the intermediate data, third k-space data and fourth k-space data that correspond to the first k-space data and the second k-space data, respectively, and in each of which at least part of a region undersampled through the corresponding undersampled pattern is filled; and generating a magnetic resonance image at a time different from any of the first time and the second time by converting k-space data obtained by combining at least part of the third k-space data and at least part of the fourth k-space data.

12 Claims, 17 Drawing Sheets

(56) References Cited

U.S. PATENT DOCUMENTS

2015/0279065 A1\* 10/2015 Li .................... G01R 33/5611
                                                      382/131
2016/0015326 A1\* 1/2016 Tanoue ................ A61B 5/742
                                                      324/318

FOREIGN PATENT DOCUMENTS

| CN | 105184755 A | \* | 12/2015 | | |
|---|---|---|---|---|---|
| JP | 2009-160378 | | 7/2009 | | |
| WO | WO-2016064990 A1 | \* | 4/2016 | .......... | G01R 33/482 |

\* cited by examiner

FIG.15
S11: COLLECT PLURALITY OF PIECES OF k-SPACE DATA
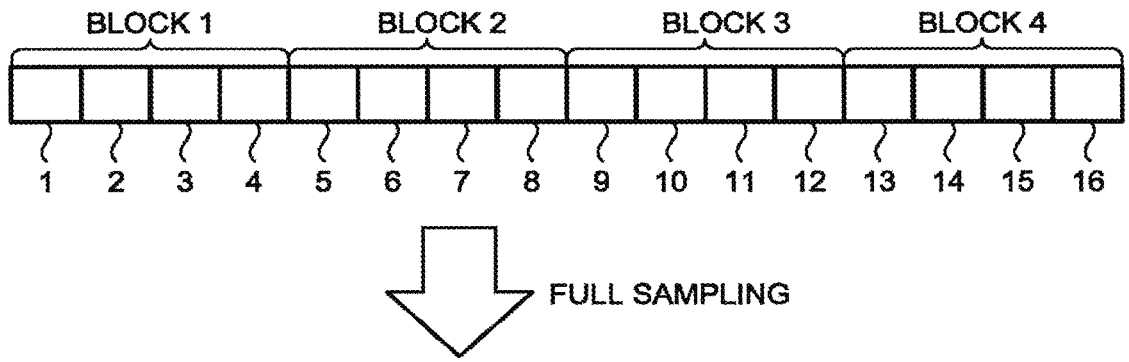
FULL SAMPLING
S12: GENERATE PLURALITY OF PIECES OF FULLY SAMPLED k-SPACE DATA
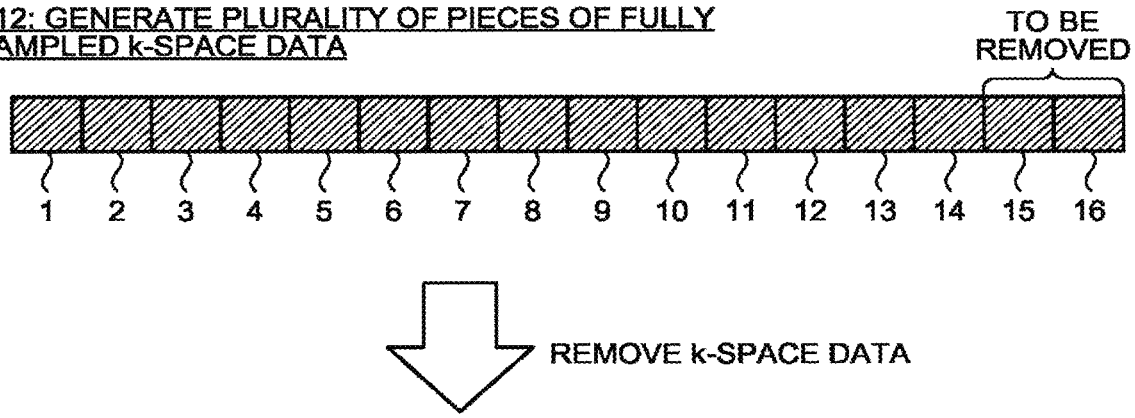
REMOVE k-SPACE DATA
S13: SELECT PLURALITY OF PIECES OF k-SPACE DATA CORRESPONDING TO APPROXIMATELY 120%
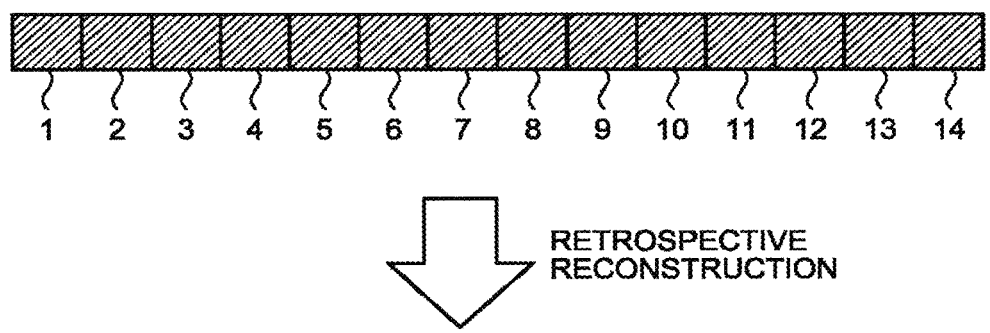
RETROSPECTIVE RECONSTRUCTION
S14: GENERATE RECONSTRUCTION IMAGE CORRESPONDING TO ACQUISITION NUMBER
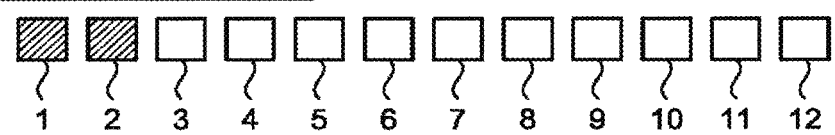

FIG.16
S21: COLLECT PLURALITY OF PIECES OF k-SPACE DATA
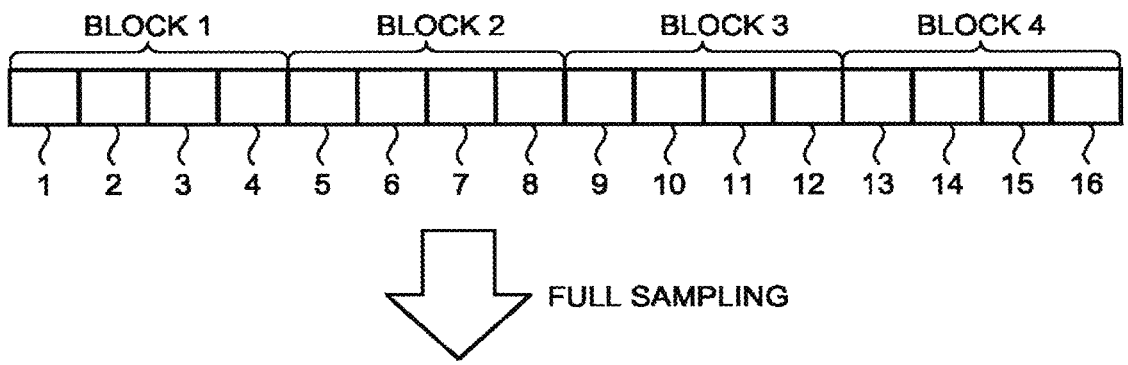
FULL SAMPLING
S22: GENERATE PLURALITY OF PIECES OF FULLY SAMPLED k-SPACE DATA
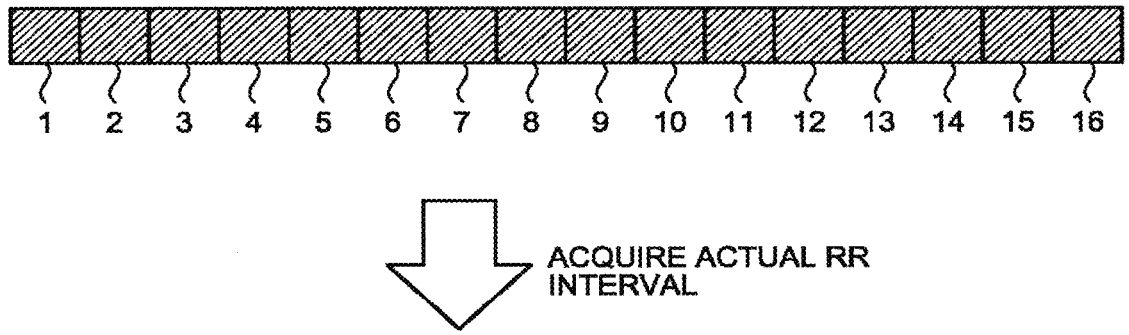
ACQUIRE ACTUAL RR INTERVAL
S23: DETERMINE WHETHER TO PERFORM REMOVAL BASED ON ACTUAL RR INTERVAL
ACTUAL RR INTERVAL IS:
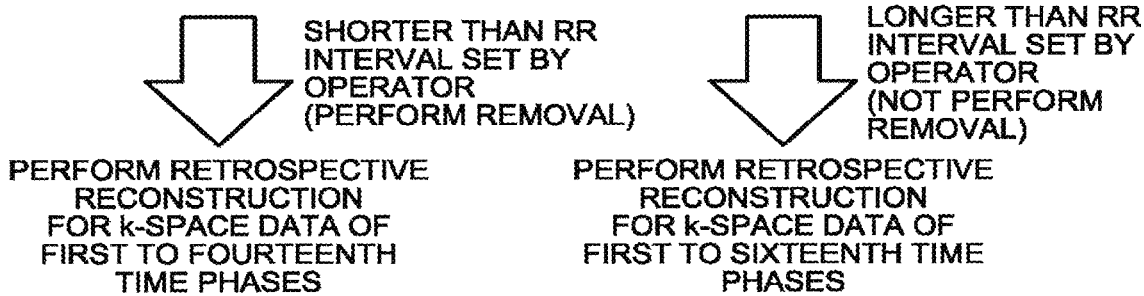

IMAGE RECONSTRUCTION METHOD

CROSS-REFERENCE TO RELATED APPLICATIONS

This application is based upon and claims the benefit of priority from Japanese Patent Application No. 2018-092339, filed on May 11, 2018; the entire contents of which are incorporated herein by reference.

FIELD

Embodiments described herein relate generally to an image reconstruction method.

BACKGROUND

In a method of observing a heart by magnetic resonance imaging (MRI), cine image capturing of the heart is performed. For example, images of the heart over a plurality of cardiac time phases are generated by performing cine image capturing under electrocardiographic synchronization while a subject holds breathing. The generated images of the cardiac time phases can be recovered in a temporal sequence in accordance with the cardiac time phases. Known methods of performing the electrocardiographic synchronization include a prospective gating method and a retrospective gating method.

BRIEF DESCRIPTION OF THE DRAWINGS

FIG. 15 is a diagram for describing processing performed by the MRI device according to the other embodiment;

FIG. 16 is a diagram for describing processing performed by the MRI device according to another embodiment.

DETAILED DESCRIPTION

Embodiments described herein are intended to provide an image reconstruction method capable of performing imaging at a desired time resolution.

An image reconstruction method according to an embodiment collects first k-space data at a first collection time and second k-space data having an undersampled pattern different from an undersampled pattern of the first k-space data at a second collection time different from the first collection time. The image reconstruction method generates intermediate data converting data including the first k-space data and the second k-space data. The image reconstruction method generates, by inversely converting the intermediate data, third k-space data and fourth k-space data that correspond to the first k-space data and the second k-space data, respectively, and in each of which at least part of a region undersampled through the corresponding undersampled pattern is filled. The image reconstruction method generates a magnetic resonance (MR) image at a time different from any of the first collection time and the second collection time by converting k-space data obtained by combining at least part of the third k-space data and at least part of the fourth k-space data.

The following describes a magnetic resonance imaging device, a medical image processing apparatus, and an image reconstruction method according to embodiments with reference to the accompanying drawings. The embodiments are not limited to the following description. The content of description in an embodiment is also applicable to another embodiment in principle.

First Embodiment

Figure 1:
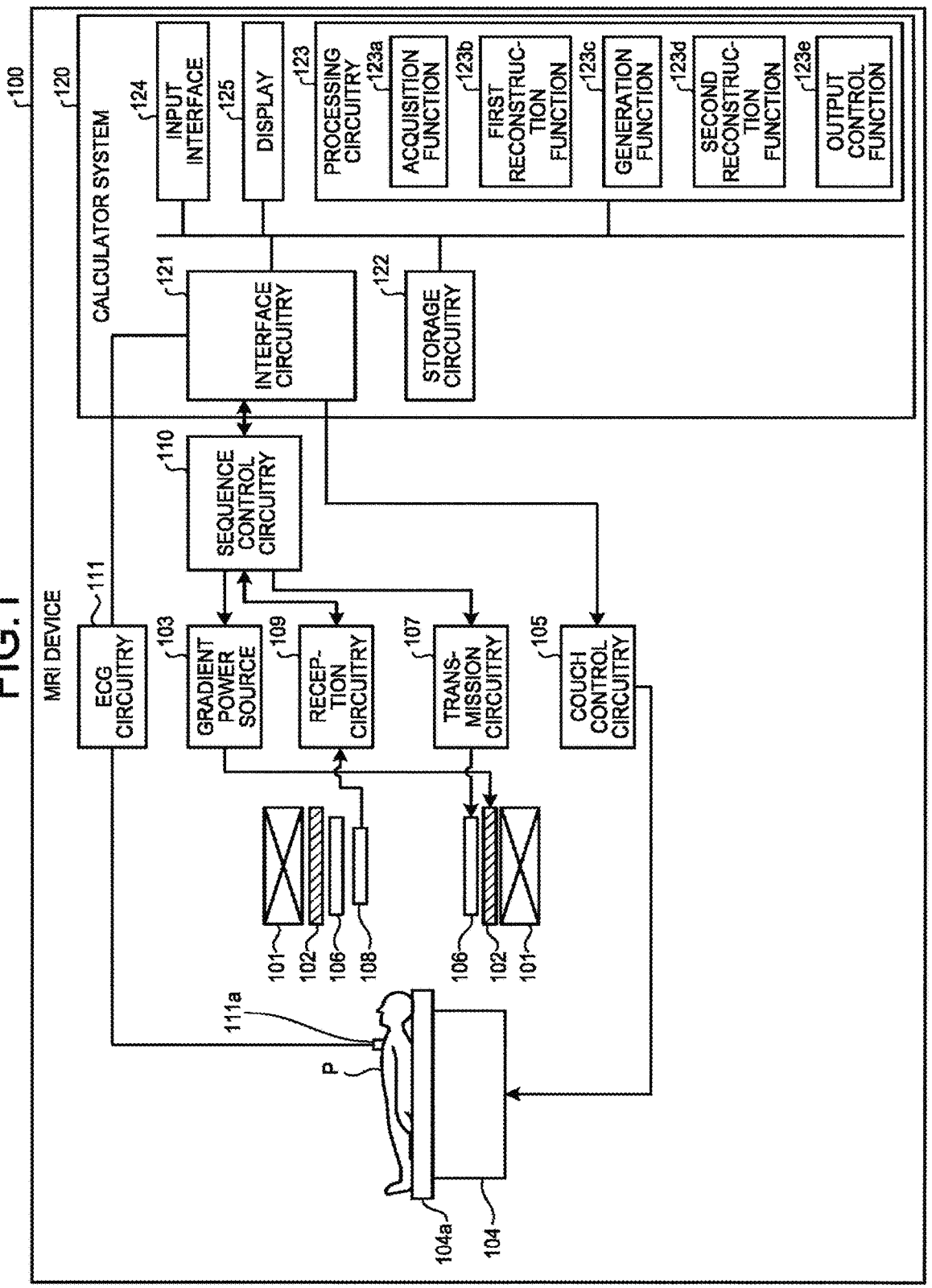
FIG. 1 is a block diagram illustrating an MRI device according to a first embodiment.

FIG. 1 is a block diagram illustrating an MRI device 100 according to a first embodiment. As illustrated in FIG. 1, the MRI device 100 includes a magnetostatic magnet 101, a gradient coil 102, a gradient power source 103, a couch 104, a couch control circuitry 105, a transmission coil 106, a transmission circuitry 107, a reception coil array 108, a reception circuitry 109, a sequence control circuitry 110, an electrocardiogram (ECG) circuitry 111, and a calculator system 120. The MRI device 100 does not include a subject P (for example, a human body).

The magnetostatic magnet 101 is a magnet formed in a hollow cylindrical shape (including a shape having an elliptical section orthogonal to the axis of a cylinder), and generates a uniform magnetostatic field in an internal space. The magnetostatic magnet 101 is, for example, a permanent magnet or a superconductive magnet.

The gradient coil 102 is a coil formed in a hollow cylindrical shape (including a shape having an elliptical section orthogonal to the axis of a cylinder), and disposed inside the magnetostatic magnet 101. The gradient coil 102 is formed by combining three coils corresponding to X, Y, and Z axes orthogonal to each other. The three coils individually receive current supply from the gradient power source 103 and each generate a gradient magnetic field having a magnetic field intensity changing along the X, Y, or Z axis. The gradient magnetic fields generated along the X, Y, and Z axes by the gradient coil 102 correspond to, for example, a slice selection gradient magnetic field Gs, a phase encode gradient magnetic field Ge, and a readout gradient magnetic field Gr, respectively. The slice selection gradient magnetic field Gs is used to optionally determine an image capturing section. The phase encode gradient magnetic field Ge is used to change the phase of an MR signal in accordance with the spatial position. The readout gradient magnetic field Gr is used to change the frequency of the MR signal in accordance with the spatial position.

The gradient power source 103 supplies current to the gradient coil 102. For example, the gradient power source 103 individually supplies current to the three coils forming the gradient coil 102.

The couch 104 includes a couchtop 104a on which the subject P is placed. The couch 104 inserts, under control of the couch control circuitry 105, the couchtop 104a into the hollow space (image capturing opening) of the gradient coil 102 while the subject P is placed on the couchtop 104a. Typically, the couch 104 is installed so that the longitudinal direction thereof is parallel to the central axis of the magnetostatic magnet 101.

The couch control circuitry 105 is a processor configured to drive, under control of the calculator system 120, the couch 104 to move the couchtop 104a in the longitudinal direction and the vertical direction.

The transmission coil 106 is disposed inside the gradient coil 102. The transmission coil 106 receives RF pulse supply from the transmission circuitry 107 and generates a high frequency magnetic field.

The transmission circuitry 107 supplies, to the transmission coil 106, an RF pulse corresponding to the kind of a target atom and a Larmor frequency determined by the intensity of a magnetic field.

The reception coil array 108 is disposed inside the gradient coil 102. The reception coil array 108 receives a magnetic resonance signal (hereinafter referred to as an MR signal) emitted from the subject P due to influence of the high frequency magnetic field. When having received the MR signal, the reception coil array 108 outputs the received MR signal to the reception circuitry 109. In the first embodiment, the reception coil array 108 includes at least one or more reception coil, and typically includes a plurality of reception coils.

The reception circuitry 109 generates MR data based on the MR signal output from the reception coil array 108. For example, the reception circuitry 109 generates the MR data by digitally converting the MR signal output from the reception coil array 108. The reception circuitry 109 transmits the generated MR data to the sequence control circuitry 110.

The reception circuitry 109 may be included in a mounting device including the magnetostatic magnet 101 and the gradient coil 102. In the first embodiment, the MR signal output from each coil element (reception coil) of the reception coil array 108 is output to the reception circuitry 109 in units called channels or the like while being distributed and synthesized as appropriate. Accordingly, the MR data is handled in units of channels in processing at the reception circuitry 109 or a later stage. The total number of the coil elements and the total number of the channels may be equal to each other. Alternatively, the total number of the channels may be smaller or larger than the total number of the coil elements. Hereinafter, when such description is made that processing is performed for "each channel", the processing may be performed for each coil element, or may be performed for each channel to which coil elements are distributed and synthesized. The timing of distribution and synthesis is not limited to the above-described timing. The MR signal or the MR data only need to be distributed and synthesized in the units of channels before reconstruction processing to be described later.

The sequence control circuitry 110 performs image capturing of the subject P by driving the gradient power source 103, the transmission circuitry 107, and the reception circuitry 109 based on sequence information transmitted from the calculator system 120. For example, the sequence control circuitry 110 is achieved by a processor. The sequence information defines the procedure of performing the image capturing. The sequence information defines the strength of power supplied from the gradient power source 103 to the gradient coil 102, the timing of the power supply, the strength of the RF pulse transmitted from the transmission circuitry 107 to the transmission coil 106, the application timing of the RF pulse, and the timing of detection of the MR signal by the reception circuitry 109.

When having received the MR data from the reception circuitry 109 after driving the gradient power source 103, the transmission circuitry 107, and the reception circuitry 109 to capture an image of the subject P, the sequence control circuitry 110 forwards the received MR data to the calculator system 120.

The ECG circuitry 111 detects a predetermined electrocardiographic waveform based on an electrocardiographic signal output from an ECG sensor 111a. The ECG sensor 111a is mounted on the body surface of the subject P to detect an electrocardiographic signal of the subject P. The ECG sensor 111a outputs the detected electrocardiographic signal to the ECG circuitry 111.

For example, the ECG circuitry 111 detects R wave as the predetermined electrocardiographic waveform. Then, the ECG circuitry 111 generates a trigger signal at the timing of detection of the R wave, and outputs the generated trigger signal to an interface circuitry 121. The trigger signal is stored in a storage circuitry 122 by the interface circuitry 121. The trigger signal may be transmitted from the ECG circuitry 111 to the interface circuitry 121 through wireless communication. In the present embodiment, the electrocardiographic signal is detected by the ECG sensor 111a, but the embodiments are not limited thereto. The electrocardiographic signal may be detected, by for example, a sphygmograph. In FIG. 1, the ECG sensor 111a and the ECG circuitry 111 are provided as part of the MRI device 100, but the embodiments are not limited thereto. The MRI device 100 may acquire an electrocardiographic signal obtained from the ECG sensor 111a and the ECG circuitry 111 provided separately from the MRI device 100.

The calculator system 120 performs, for example, entire control of the MRI device 100, data collection, and image reconstruction. The calculator system 120 includes the interface circuitry 121, the storage circuitry 122, a processing circuitry 123, an input interface 124, and a display 125.

The interface circuitry 121 transmits the sequence information to the sequence control circuitry 110, and receives the MR data from the sequence control circuitry 110. Having received the MR data, the interface circuitry 121 stores the received MR data in the storage circuitry 122.

The MR data stored in the storage circuitry 122 is disposed in the k space by the processing circuitry 123. As a result, the storage circuitry 122 stores k-space data for a plurality of channels. In this manner, the k-space data is collected. The interface circuitry 121 is achieved by, for example, a network interface card.

The storage circuitry 122 stores, for example, the MR data received by the interface circuitry 121, temporal sequence data (k-t space data) disposed in the k space by an acquisition function 123a to be described later, and image data generated by a second reconstruction function 123d to be described later. The storage circuitry 122 also stores various computer programs. The storage circuitry 122 is achieved by, for example, a random access memory (RAM), a semiconductor memory element such as a flash memory, a hard disk, or an optical disk.

The input interface 124 receives input of various instructions and information from an operator such as a doctor or a clinical radiologist. The input interface 124 is achieved by, for example, a track ball, a switch button, a mouse, or a keyboard. The input interface 124 is connected with the processing circuitry 123. The input interface 124 converts an input operation received from the operator into an electric signal, and outputs the electric signal to the processing circuitry 123.

The display 125 displays, under control of the processing circuitry 123, various graphical user interfaces (GUI), a magnetic resonance (MR) image generated by the second reconstruction function 123d, and the like.

The processing circuitry 123 performs entire control of the MRI device 100. Specifically, the processing circuitry 123 generates the sequence information based on an image capturing condition input from the operator through the input interface 124, and transmits the generated sequence information to the sequence control circuitry 110, thereby controlling image capturing. The processing circuitry 123 also controls image reconstruction performed based on the MR data transferred as an image capturing result from the sequence control circuitry 110, and controls display on the display 125. The processing circuitry 123 is achieved by a processor.

The processing circuitry 123 includes the acquisition function 123a, a first reconstruction function 123b, a generation function 123c, the second reconstruction function 123d, and an output control function 123e. The acquisition function 123a is an exemplary acquisition unit. The first reconstruction function 123b is an exemplary first reconstruction unit. The generation function 123c is an exemplary generation unit. The second reconstruction function 123d is an exemplary second reconstruction unit. The output control function 123e is an exemplary output control unit.

Processing functions such as the acquisition function 123a, the first reconstruction function 123b, the generation function 123c, the second reconstruction function 123d, and the output control function 123e as components of the processing circuitry 123 are stored in the storage circuitry 122 in the form of computer-executable computer programs. The processing circuitry 123 reads each computer program from the storage circuitry 122 and executes the read computer program to achieve a function corresponding to the computer program. In other words, the processing circuitry 123 having read each computer program has the corresponding function illustrated in the processing circuitry 123 in FIG. 1. In FIG. 1, the processing functions of the acquisition function 123a, the first reconstruction function 123b, the generation function 123c, the second reconstruction function 123d, and the output control function 123e are achieved by the single processing circuitry 123, but the processing circuitry 123 may be configured as a combination of a plurality of independent processors, and each processing function may be achieved by a processor executing the corresponding computer program.

The term "processor" used in the above description means, for example, a central preprocess unit (CPU), a graphics processing unit (GPU), or a circuit such as an application specific integrated circuit (ASIC) or a programmable logic device (for example, a simple programmable logic device (SPLD), a complex programmable logic device (CPLD), or a field programmable gate array (FPGA)). A computer program may be directly incorporated in a circuit of the processor instead of being stored in the storage circuitry 122. In this case, the processor reads and executes the computer program incorporated in the circuit to achieve the corresponding function.

Typically, an MRI device measures, by using a coil, electromagnetic wave released from a subject. A signal obtained by digitizing the measured electromagnetic wave is referred to as k-space data.

The k-space data is, for example, two-dimensional or three-dimensional data obtained by repeating one-dimensional image capturing. An image of atomic distribution inside the subject can be obtained by performing Fourier transform (hereinafter, Fourier transform includes inverse Fourier transform in some cases) of the k-space data. The obtained atomic distribution image is referred to as an MR image, and the process of calculating the MR image from the k-space data is referred to as, for example, reconstruction, image reconstruction, or image generation. A central part of the k-space data corresponds to a low frequency component in Fourier transform of the MR image, and a peripheral part of the k-space data corresponds to a high frequency component in Fourier transform of the MR image.

The MRI device obtains the k-space data necessary for reconstruction by repeating one-dimensional image capturing, but it is known that this image capturing typically takes time. It is also known that the image quality of the reconstructed MR image degrades when the state of the subject changes with time. Thus, it has been strongly requested to reduce, for example, a time taken for image capturing of the heart when the state of the subject changes and a large data amount of temporal sequence data needs to be acquired. For this reason, to perform faster image capturing, for example, parallel imaging (PI) has been researched and developed in which the characteristic that sensitivity differs with coil disposition is exploited to obtain k-space data through undersampled image capturing simultaneously with a plurality of coils and reconstruct an MR image with reduced artifact from a plurality of pieces of k-space data thus obtained.

Typically, in the PI, the image capturing time is reduced by collecting the k-space data in an undersampling manner in a phase encode direction. An alias image is generated from the k-space data collected in an undersampling manner, and thus in the PI, an image without alias is reconstructed from the k-space data collected through a plurality of channels having sensitivities different from each other by using the sensitivity difference between the channels. Accordingly, in the PI, speeding-up is achieved in accordance with an undersampling rate. The undersampling rate is also referred to as a speed multiplication rate. For example, when the undersampling rate is four, the image capturing time is reduced to a quarter approximately.

When the PI is combined with view sharing processing, the time resolution is expected to increase. Specifically, pieces of k-space data undersampled in the phase encode direction are collected over a plurality of time phases through the PI. Then, an image corresponding to an intermediate time phase between the two time phases is reconstructed by sharing the k-space data between two time phases adjacent to each other. Accordingly, the time resolution approximately twice as high can be obtained while fast image capturing is executed through the PI.

To achieve further speeding up (reducing image capturing time), it is effective to acquire the k-space data in an undersampling manner in a time phase direction (time direction) in addition to the phase encode direction. Known methods of collecting the k-space data in an undersampling manner in the time phase direction include, for example, technologies of k-space time broad-use linear acquisition speed-up technique (k-t BLAST) and k-t SENSE. The k-t BLAST refers to a case in which the number of coils is small as compared to the ratio of undersampling, and the k-t SENSE refers to the opposite case. However, in the following description, the k-t SENSE and the k-t BLAST are collectively referred to as the k-t SENSE unless explicitly distinguished. The following mainly describes a case in which a plurality of coils are provided, but a case in which only one coil is provided is allowed as a special case of the k-t BLAST. For the sake of simplicity, the case of one coil is also referred to as the k-t SENSE.

In the k-t SENSE, collected pieces of k-space data are converted into x-f space data including an image space and a time spectrum through Fourier transform. Then, the x-f space data is used to generate x-f space data from which an alias signal is removed by using a sensitivity map in an x-f space. Then, a plurality of temporally sequential MR images are generated by converting the generated x-f space data into x-t space data through inverse Fourier transform.

However, in the k-t SENSE, an undersampling pattern (sampling pattern) of k-space data regularly changes along the temporal sequence. For example, in the k-t SENSE, the undersampling pattern is shifted by one sample in the phase encode direction for each unit time phase when sampling is performed. Thus, when the view sharing processing is performed on pieces of k-space data collected by the k-t SENSE and the k-space data is shared between two time phases adjacent to each other, different kinds of undersampling pattern are included in mixture in the undersampling pattern of k-space data included in the intermediate time phase. Accordingly, reconstruction of the intermediate time phase by the view sharing processing cannot be performed in the k-t SENSE.

The MRI device 100 according to the first embodiment executes the following processing functions to obtain an image at a desired time resolution while executing fast image capturing through undersampling.

Specifically, in the MRI device 100 according to the first embodiment, the acquisition function 123a acquires a plurality of pieces of k-space data at a plurality of collection times by undersampling through, for example, Cartesian collection or radial collection. The first reconstruction function 123b reconstructs first image data from the k-space data through reconstruction processing corresponding to the undersampling. The generation function 123c generates a plurality of pieces of k-space data corresponding to full sampling through inverse Fourier transform of the first image data, and generates a pseudo collection time of each piece of k-space data. The second reconstruction function 123d performs sorting processing on the pieces of k-space data corresponding to full sampling based on the pseudo collection time, and reconstructs second image data by using the k-space data after the sorting processing. In the first embodiment, the second reconstruction function 123d performs, as the sorting processing, the view sharing processing by using the pieces of k-space data corresponding to full sampling. Accordingly, the MRI device 100 according to the first embodiment can perform imaging at a desired time resolution.

The present embodiment is preferably applied to the PI such as the k-t SENSE in which k-space data is collected in an undersampling manner in the phase encode direction and the time phase direction, but is not limited thereto. For example, the present embodiment is also applicable to the PI in which k-space data is collected in an undersampling manner only in the phase encode direction. For example, the present embodiment is also applicable to compressed sensing (CS) in which sampling is irregularly performed in an undersampling manner in the phase encode direction. The compressed sensing is a fast image capturing method in which an image is reconstructed from a small number of pieces of k-space data by using signal sparsity. The radial collection or the Cartesian collection is preferably performed as a collection method in the compressed sensing.

In the k-t SENSE described above, calibration scanning (also called training scanning) is typically performed before or halfway through the image capturing to obtain the sensitivity map. The calibration scanning is image capturing in which undersampling in the time direction is not performed near the center in the phase encode direction. However, in the present embodiment, the sensitivity map can be obtained without performing the calibration scanning. For example, in the present embodiment, the strength of an alias signal in a time spectrum direction is utilized: the sensitivity map is directly estimated for the low frequency component for which the alias signal is relatively weak, and the sensitivity map is obtained for the high frequency component through estimation using the low frequency component.

Figure 2:
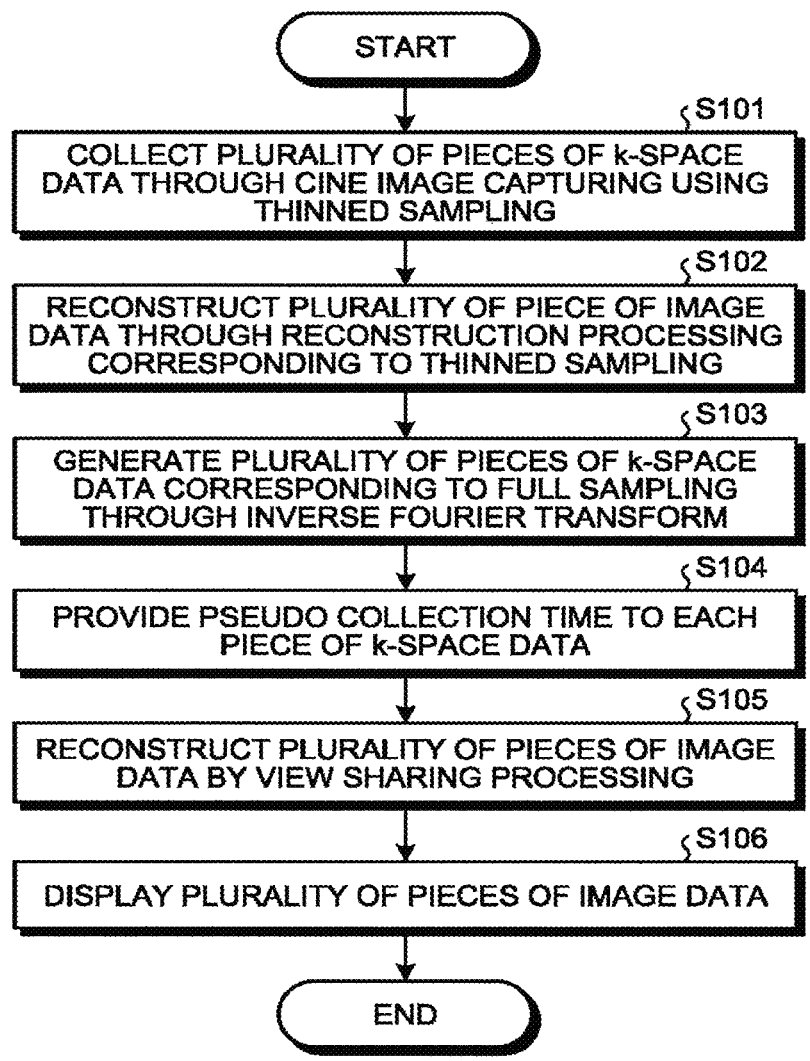
FIG. 2 is a flowchart illustrating a processing procedure executed by the MRI device according to the first embodiment.

The following describes a processing procedure executed by the MRI device 100 according to the first embodiment with reference to FIG. 2. FIG. 2 is a flowchart illustrating the processing procedure executed by the MRI device 100 according to the first embodiment. The processing procedure illustrated in FIG. 2 is started upon, for example, an image capturing start request input by the operator. The following description is made in a case in which the k-t SENSE is executed, but the embodiments are not limited thereto. The following description is also made in a case in which an image capturing site is the heart, but the embodiments are not limited thereto.

At step S101, the acquisition function 123a collects a plurality of pieces of k-space data through cine image capturing using undersampling. The k-space data acquired by the acquisition function 123a is exemplary first k-space data and second k-space data. A collection time associated with the first k-space data is an exemplary first collection time. A collection time associated with the second k-space data is an exemplary second collection time.

At step S102, the first reconstruction function 123b reconstructs a plurality of piece of image data through reconstruction processing corresponding to the undersampling. The image data reconstructed by the first reconstruction function 123b is exemplary first image data.

Figure 3:
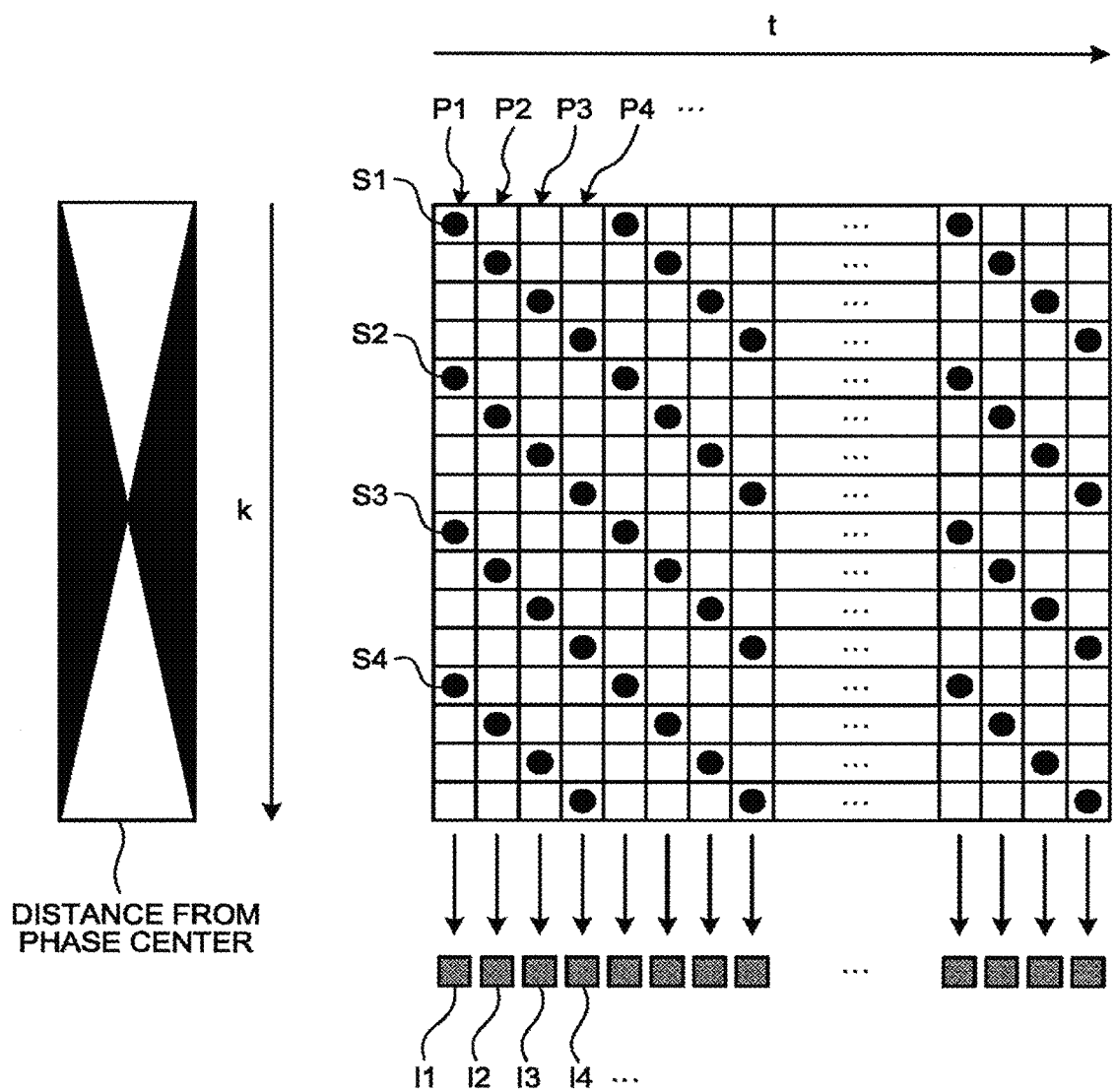
FIG. 3 is a diagram for describing processing of an acquisition function and a first reconstruction function according to the first embodiment.

The following describes processing executed by the acquisition function 123a and the first reconstruction function 123b according to the first embodiment with reference to FIG. 3. FIG. 3 is a diagram for describing the processing executed by the acquisition function 123a and the first reconstruction function 123b according to the first embodiment. In FIG. 3, "k" on the vertical axis corresponds to the phase encode direction, and "t" on the horizontal axis corresponds to the time phase direction. For the sake of description, FIG. 3 exemplarily illustrates k-t space data in which pieces of k-space data are disposed at 16 sampling positions (cells) in the phase encode direction. Each black circle represents a position at which k-space data of one line is collected. In other words, a cell with no black circle represents a position at which no k-space data is collected. Each piece of k-space data corresponds to a two-dimensional k space including a one-dimensional frequency encode direction and a one-dimensional phase encode direction.

For example, the acquisition function 123a generates sequence information based on an image capturing condition input by the operator through the input interface 124. For example, various image capturing conditions for executing the k-t SENSE are set to the sequence information. Then, the acquisition function 123a transmits the generated sequence information to the sequence control circuitry 110 to cause the sequence control circuitry 110 to execute the k-t SENSE. Accordingly, the acquisition function 123a collects four pieces of k-space data (samples) for each of time phases P1, P2, P3, P4, . . . . For example, the time phase P1 includes four pieces of k-space data S1, S2, S3, and S4.

In the example illustrated in FIG. 3, the sampling position is shifted by one sample in the phase encode direction for each unit time phase when sampling is performed. For example, the four pieces of k-space data included in the time phase P2 are sampled at positions shifted by one sample in the phase encode direction (the downward direction in FIG. 3) as compared to the four pieces of k-space data included in the time phase P1. The four pieces of k-space data included in the time phase P3 are sampled at positions shifted by one sample in the phase encode direction as compared to the four pieces of k-space data included in the time phase P2. The four pieces of k-space data included in the time phase P4 are sampled at positions shifted by one sample in the phase encode direction as compared to the four pieces of k-space data included in the time phase P3. Accordingly, in the example illustrated in FIG. 3, the k-space data undersampled to a quarter is periodically sampled for each four unit time phases. In other words, the acquisition function 123a collects the first k-space data at the first collection time, and the second k-space data having an undersampling pattern different from that of the first k-space data at the second collection time different from the first collection time. In the second k-space data, filled lines in the phase encode direction are different from those of the first k-space data.

For the sake of illustration, a plurality of pieces of k-space data included in each time phase are illustrated at an identical position in the time phase direction and thus appear to be collected at an identical time, but in reality, are collected at times different from each other. For example, the four pieces of k-space data included in the time phase P1 are collected in the order of the pieces of k-space data S1, S2, S3, and S4. The collection time of each piece of k-space data is associated with each piece of k-space data. Accordingly, the acquisition function 123a acquires the pieces of k-space data and the collection times associated with the respective pieces of k-space data.

The rectangle on the left side in FIG. 3 is a diagram illustrating the distance between each piece of k-space data and a phase center. The longitudinal direction of the rectangle corresponds to the phase encode direction, and the length of the white region in the lateral direction corresponds to the distance from the phase center. Thus, in the example illustrated in FIG. 3, the k-space data S3 is positioned closest to the phase center among the pieces of k-space data S1 to S4, and the k-space data S1 is positioned farthest from the phase center.

Then, the first reconstruction function 123b converts the k-space data of each time phase into x-f space data including the image space and the time spectrum through Fourier transform. The first reconstruction function 123b uses the x-f space data to generate x-f space data from which an alias signal is removed by using the sensitivity map in the x-f space. Then, the first reconstruction function 123b generates a plurality of temporally sequential pieces of image data by converting the generated x-f space data into x-t space data through inverse Fourier transform.

Specifically, as illustrated in FIG. 3, the first reconstruction function 123b generates pieces of image data I1, I2, I3, and I4 corresponding to the respective time phases P1, P2, P3, and P4 from the k-t space data of the time phases by executing reconstruction processing corresponding to the k-t SENSE.

The sampling and reconstruction processing by the k-t SENSE illustrated in FIG. 3 are just by example, and can be applied to other publicly known technologies. For example, FIG. 3 illustrates a case in which the sensitivity map is generated without executing the calibration scanning, but the processing is also applicable to a case in which the sensitivity map is generated by executing the calibration scanning.

The description continues with reference to FIG. 2. At step S103, the generation function 123c generates a plurality of pieces of k-space data corresponding to full sampling through inverse Fourier transform. The k-space data generated by the generation function 123c is exemplary third k-space data and exemplary fourth k-space data. The pieces of k-space data corresponding to full sampling are data in which k-space data corresponding to k-space data undersampled by non-simple undersampling is compensated (filled). In other words, the first reconstruction function 123b generates intermediate data by converting data including the first k-space data and the second k-space data. Then, the first reconstruction function 123b generates, by inversely converting the intermediate data, third k-space data and fourth k-space data that correspond to the first k-space data and the second k-space data, respectively, and in each of which at least part of a region undersampled through the corresponding undersampled pattern is filled.

At step S104, the generation function 123c provides a pseudo collection time to each piece of the k-space data.

Figure 4:
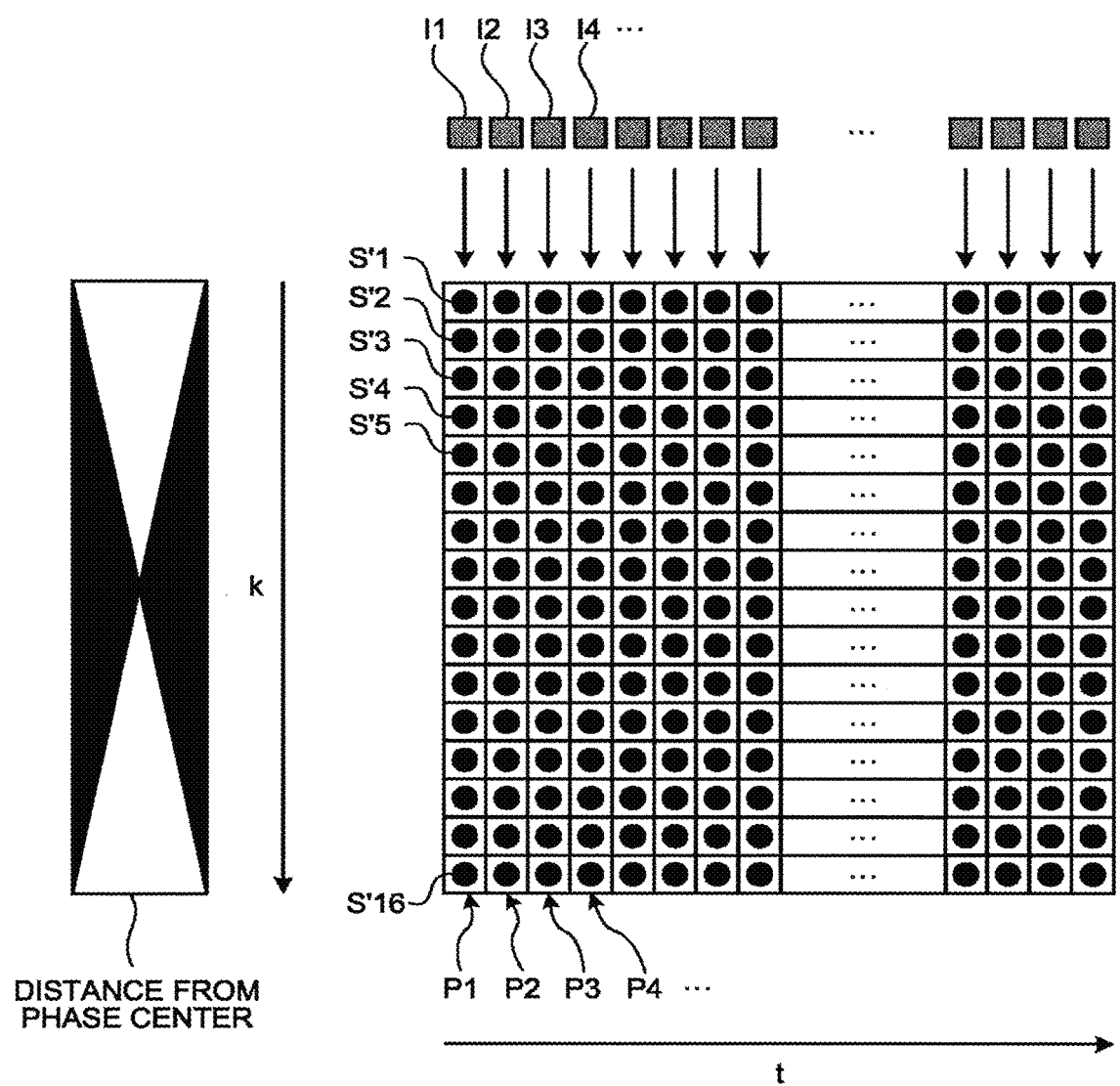
FIG. 4 is a diagram for describing processing of a generation function according to the first embodiment.

The following describes processing executed by the generation function 123c according to the first embodiment with reference to FIG. 4. FIG. 4 is a diagram for describing the processing executed by the generation function 123c according to the first embodiment. FIG. 4 exemplarily illustrates k-t space data same as that in FIG. 3.

As illustrated in FIG. 4, the generation function 123c executes inverse Fourier transform (IFFT) of pieces of image data I1, I2, I3, I4, . . . of the respective time phases P1, P2, P3, P4, . . . . Accordingly, the generation function 123c generates a plurality of pieces of k-space data of the time phases P1, P2, P3, P4, . . . corresponding to a state in which the k-t space is fully sampled. For example, the generation function 123c generates 16 pieces of k-space data S'1, S'2, S'3, . . . , S'16 through inverse Fourier transform of the image data I1. The 16 pieces of k-space data S'1, S'2, S'3, . . . , S'16 correspond to full sampling at 16 sampling positions of the time phase P1. Similarly, the generation function 123c generates a plurality of pieces of k-space data corresponding to full sampling for the other time phases.

Then, the generation function 123c provides pseudo collection times to the pieces of k-space data corresponding to full sampling. For example, the k-space data S'1 has a time phase and a phase encode amount identical to those of the k-space data S1 illustrated in FIG. 3. Thus, the generation function 123c provides the collection time of the k-space data S1 as the collection time of the k-space data S'1. The k-space data S'5 has a time phase and a phase encode amount identical to those of the k-space data S2 illustrated in FIG. 3. Thus, the generation function 123c provides the collection time of the k-space data S2 as the collection time of the k-space data S'5.

The pieces of k-space data S'2, S'3, and S'4 are disposed at an equal interval between the pieces of k-space data S'1 and S'5. Thus, the generation function 123c provides times obtained by equally dividing, into four parts, the duration between the collection time of the k-space data S'1 and the collection time of the k-space data S'5 as the collection times of the pieces of k-space data S'2, S'3, and S'4. Specifically, the collection time of the k-space data S'3 is the middle value between the collection time of the k-space data S'1 and the collection time of the k-space data S'5. The collection time of the k-space data S'2 is the middle value between the collection time of the k-space data S'1 and the collection time of the k-space data S'3. The collection time of the k-space data S'4 is the middle value between the collection time of the k-space data S'3 and the collection time of the k-space data S'5. In this manner, the generation function 123c calculates a pseudo collection time of k-space data corresponding to full sampling based on the collection time of the k-space data, and provides the pseudo collection time to the k-space data.

The description continues with reference to FIG. 2. At step S105, the second reconstruction function 123d reconstructs a plurality of pieces of image data by the view sharing processing. For example, the second reconstruction function 123d performs the view sharing processing by using a plurality of pieces of k-space data corresponding to full sampling and generated by the generation function 123c. The image data reconstructed by the second reconstruction function 123d is exemplary second image data.

Figure 5:
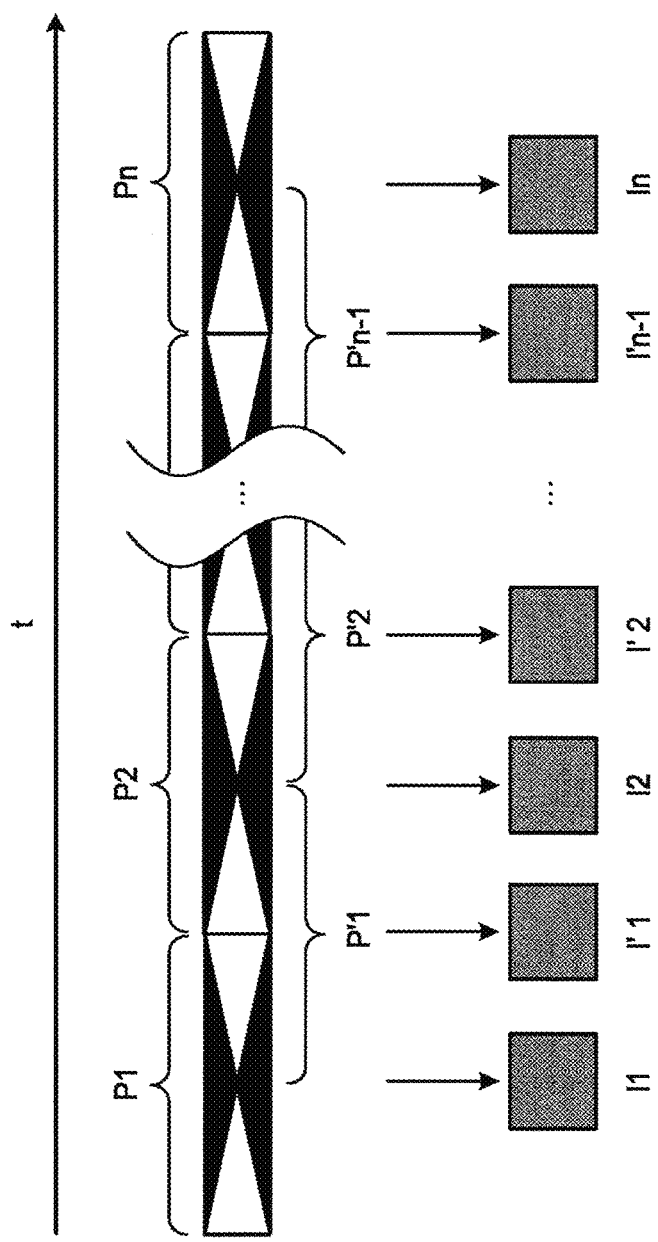
FIG. 5 is a diagram for describing processing of a second reconstruction function according to the first embodiment.
Figure 6:
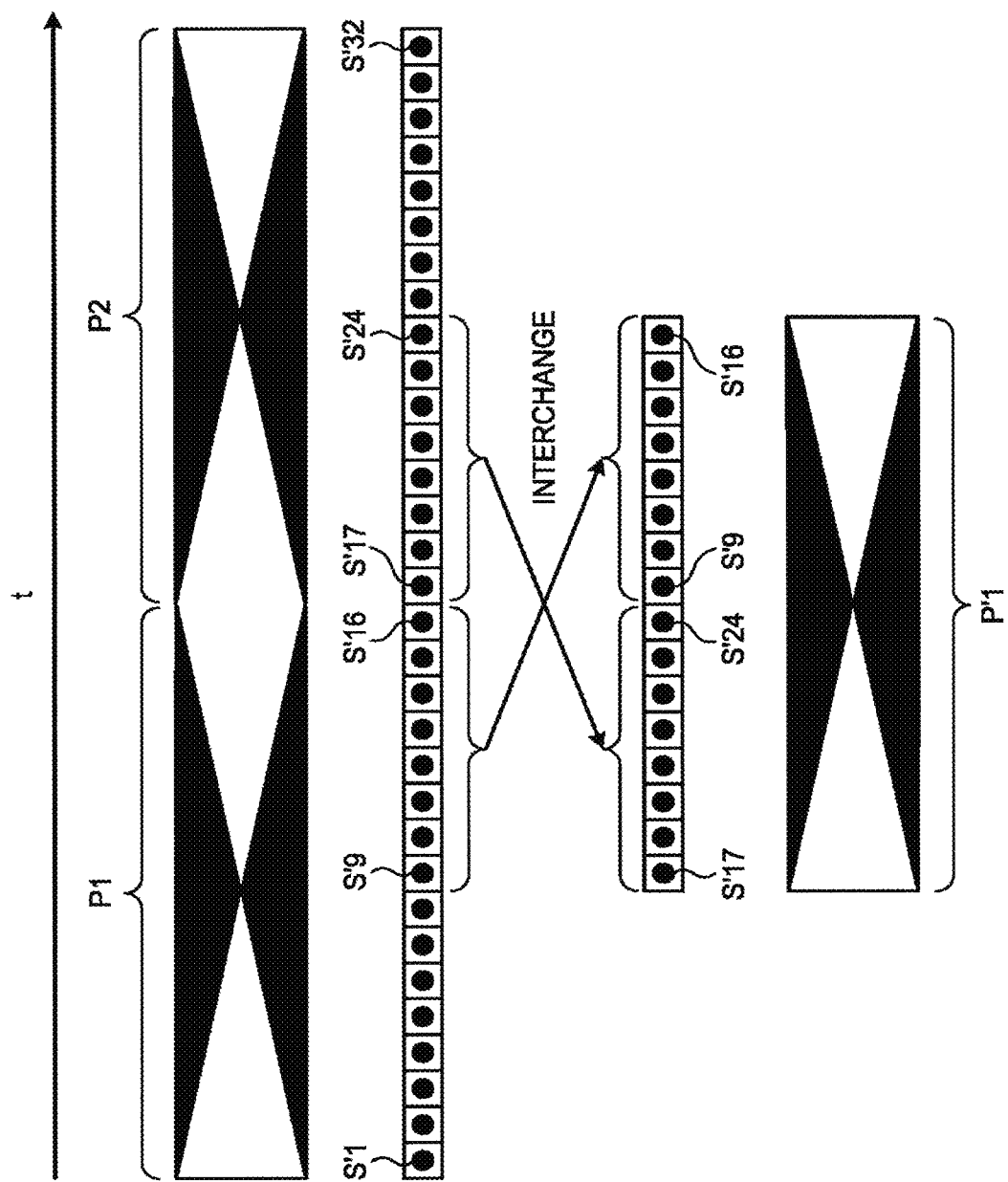
FIG. 6 is a diagram for describing processing of the second reconstruction function according to the first embodiment.

The following describes processing executed by the second reconstruction function 123d according to the first embodiment with reference to FIGS. 5 and 6. FIGS. 5 and 6 are each a diagram for describing the processing executed by the second reconstruction function 123d according to the first embodiment. In FIGS. 5 and 6, "t" on the horizontal axis corresponds to the time phase direction. Each rectangle corresponding to one of time phases P1 to Pn is a diagram illustrating the distance between each piece of k-space data and the phase center. The lateral direction of the rectangle corresponds to the phase encode direction, and the length of the white region in the longitudinal direction corresponds to the distance from the phase center. Thus, each rectangle in FIGS. 5 and 6 is obtained by rotating the rectangle in FIG. 3 by 90° and is illustrated for each time phase.

As illustrated in FIG. 5, the second reconstruction function 123d performs the view sharing processing by using the k-space data of the time phases P1 to Pn. For example, the second reconstruction function 123d performs the view sharing processing by using the k-space data of the time phase P1 and the k-space data of the time phase P2. The view sharing processing is also called sliding window processing.

As illustrated in FIG. 6, the time phase P1 includes 16 pieces of k-space data S'1 to S'16 corresponding to full sampling. The time phase P2 includes 16 pieces of k-space data S'17 to S'32 corresponding to full sampling. In this case, the second reconstruction function 123d extracts the eight pieces of k-space data S'9 to S'16 of the time phase P1 and the eight pieces of k-space data S'17 to S'24 of the time phase P2. Then, the second reconstruction function 123d interchanges the extracted 16 pieces of k-space data in accordance with a phase encode pattern of a single image.

For example, the second reconstruction function 123d interchanges the eight pieces of k-space data S'9 to S'16 extracted from the time phase P1 and the eight pieces of k-space data S'17 to S'24 extracted from the time phase P2. In this case, the second reconstruction function 123d performs the interchange while maintaining the order of the collection times of the pieces of k-space data S'9 to S'16 and the order of the collection times of the pieces of k-space data S'17 to S'24. Accordingly, the second reconstruction function 123d sorts the pieces of k-space data in the order of S'17, S'18, S'19, S'20, S'21, S'22, S'23, S'24, S'9, S'10, S'11, S'12, S'13, S'14, S'15, and S'16. As a result, the 16 pieces of k-space data arranged in this order match the phase encode pattern of a single image, and thus the second reconstruction function 123d uses the 16 pieces of k-space data as k-space data of a time phase P'1 for reconstruction. The time phase P'1 corresponds to the intermediate time phase between the time phase P1 and the time phase P2. Then, the second reconstruction function 123d performs reconstruction processing (Fourier transform processing) on the k-space data of the time phase P'1 to generate image data I'1 corresponding to the time phase P'1.

In this manner, the second reconstruction function 123d extracts k-space data corresponding to the intermediate time phase from a plurality of pieces of k-space data included in two continuous time phases. Then, the second reconstruction function 123d generates image data corresponding to the intermediate time phase by performing the reconstruction processing on the extracted k-space data corresponding to the intermediate time phase. Specifically, the second reconstruction function 123d generates a magnetic resonance (MR) image at a time different from any of the first collection time and the second collection time by converting k-space data obtained by combining at least part of the third k-space data and at least part of the fourth k-space data. Through the series of processing, the second reconstruction function 123d can generate pieces of image data in the phase number of "2n−1" by generating each of pieces of image data of the intermediate time phase in the phase number of "n−1" between the corresponding pair of pieces of image data in the phase number of "n" (refer to FIG. 5). In other words, the second reconstruction function 123d can approximately double the time resolution.

The description continues with reference to FIG. 2. At step S106, the output control function 123e displays a plurality of pieces of image data. For example, the output control function 123e performs cine regeneration of the pieces of image data in the phase number of "2n−1" generated by the second reconstruction function 123d. The output control function 123e is not limited to the cine regeneration but, for example, may display side by side a plurality of temporally sequentially arranged pieces of image data.

As described above, in the MRI device 100 according to the first embodiment, the acquisition function 123a acquires a plurality of pieces of k-space data at a plurality of collection times by undersampling. The first reconstruction function 123b reconstructs the first image data from the k-space data through reconstruction processing corresponding to the undersampling. The generation function 123c generates a plurality of pieces of k-space data corresponding to full sampling through inverse Fourier transform of the first image data, and generates the pseudo collection time of each piece of k-space data. The second reconstruction function 123d performs the view sharing processing on the k-space data based on the pseudo collection time, and reconstructs the second image data by using the k-space data after the view sharing processing. Accordingly, the MRI device 100 according to the first embodiment can obtain an image having a time resolution approximately twice as high while executing fast image capturing through undersampling.

The processing executed by the MRI device 100 according to the first embodiment may be executed in real time or may be executed later by reading a plurality of pieces of k-space data collected in advance. When the processing is executed later, information in which each piece of k-space data collected through undersampling is associated with the collection time of the piece of k-space data is stored in a predetermined storage device (such as the storage circuitry 122) in advance.

Modification of First Embodiment

The first embodiment describes a case in which the view sharing processing is performed, but is not limited thereto. For example, the MRI device 100 can generate an optional phase number (optional number) of pieces of image data by using a plurality of pieces of k-space data corresponding to full sampling and generated through inverse Fourier transform.

For example, the second reconstruction function 123d extracts a predetermined number of pieces of k-space data corresponding to image data in a desired time phase number from a plurality of temporally sequentially arranged pieces of k-space data corresponding to full sampling. Then, the second reconstruction function 123d generates pieces of second image data in a desired time phase number through reconstruction after interchanging the predetermined number of extracted pieces of k-space data in accordance with a phase encode pattern.

Figure 7:
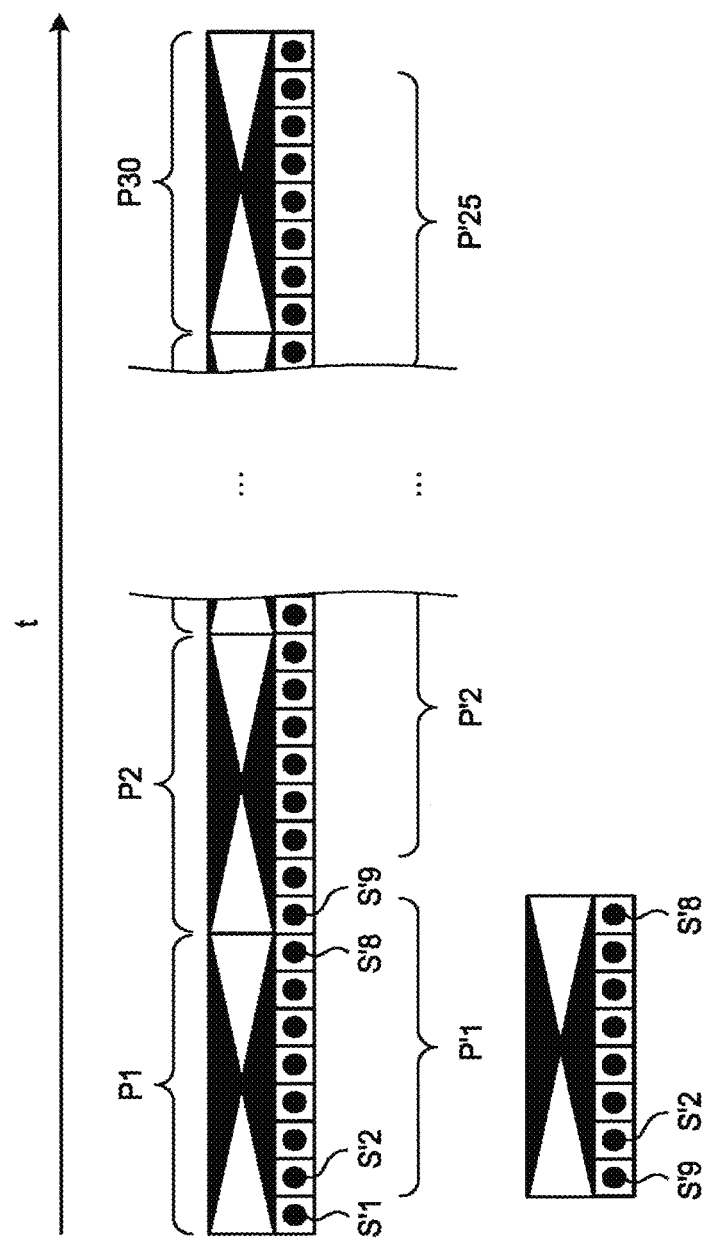
FIG. 7 is a diagram for describing processing of the second reconstruction function according to a modification of the first embodiment.

The following describes processing executed by the second reconstruction function 123d according to a modification of the first embodiment with reference to FIG. 7. FIG. 7 is a diagram for describing the processing executed by the second reconstruction function 123d according to the modification of the first embodiment. In FIG. 7, "t" on the horizontal axis corresponds to the time phase direction. Rectangles corresponding to time phases P1 to P30 are the same as the rectangles illustrated in FIG. 5.

In the example illustrated in FIG. 7, pieces of image data in the phase number of "25" are generated from pieces of image data in the phase number of "30". In this case, image capturing has been performed for the pieces of image data in the phase number of "30", and a plurality of pieces of k-space data corresponding to the phase number of "30" and the collection time of each piece of k-space data are stored in the storage circuitry 122 in advance. Then, the operator performs an input for browsing the pieces of image data in the phase number of "25" based on the stored k-space data.

Having received the input for browsing the pieces of image data in the phase number of "25", the generation function 123c generates a plurality of pieces of k-space data corresponding to full sampling and provides a pseudo collection time to each piece of k-space data. The processing so far is the same as the processing at steps S101 to S104 in FIG. 2, and description thereof will be omitted.

Then, as illustrated in FIG. 7, the second reconstruction function 123d extracts a predetermined number of pieces of k-space data corresponding to the phase number of "25" from the temporally sequential k-space data corresponding to full sampling. In the example illustrated in FIG. 7, the number of samples (the number of pieces of k-space data) included in each time phase is "eight". Thus, the second reconstruction function 123d extracts, as sets (each corresponding to one time phase) of eight continuous pieces of k-space data, k-space data of 25 time phases from among k-space data of the time phases P1 to P30. Accordingly, the second reconstruction function 123d extracts k-space data of time phases P'1 to P'25.

Then, the second reconstruction function 123d performs reconstruction after interchanging the eight extracted pieces of k-space data in accordance with the phase encode pattern.

As a specific example, the second reconstruction function 123d extracts the eight pieces of k-space data S'2 to S'9 for the time phase P'1. The seven pieces of k-space data S'2 to S'8 are pieces of k-space data attributable to the time phase P1, and the k-space data S'9 is the k-space data attributable to the time phase P2. The second reconstruction function 123d sorts the pieces of k-space data in the order of S'9, S'2, S'3, S'4, S'5, S'6, S'7, and S'8. As a result, the eight pieces of k-space data arranged in this order match the phase encode pattern of a single image, and thus the second reconstruction function 123d uses the eight pieces of k-space data as the k-space data of the time phase P'1 for reconstruction. Then, the second reconstruction function 123d extracts k-space data of the time phases P'2 to P'25 through the same processing and uses the k-space data for reconstruction.

Accordingly, the second reconstruction function 123d can generate the pieces of image data in the phase number of "25" from the pieces of image data in the phase number of "30" at an equal interval. In FIG. 7, the number of phases is reduced from "30" to "25", but the embodiments are not limited thereto. For example, the number of phases may be increased to "35". In this case, the same k-space data is shared between the new time phases P'1 and P'2.

Second Embodiment

In the first embodiment, the time resolution is increased by the view sharing processing, but the embodiments are not limited thereto. For example, when k-space data of an identical slice over a plurality of heartbeats is collected through image capturing by a prospective gating method (hereinafter referred to as "prospective image capturing"), the time resolution can be increased by using the k-space data over the heartbeats.

The MRI device 100 according to a second embodiment has a configuration same as that of the MRI device 100 illustrated in FIG. 1, but part of the processing at the processing circuitry 123 is different. Thus, in the second embodiment, description is mainly made on any feature different from that of the first embodiment, and any component having a function same as that described in the first embodiment will be omitted in the description.

Specifically, in the MRI device 100 according to the second embodiment, the acquisition function 123a acquires a plurality of pieces of k-space data over a plurality of heartbeats in accordance with detection of a feature point in an electrocardiographic signal of a subject, and acquires first cardiac time phase information corresponding to each collection time. The first reconstruction function 123b reconstructs a plurality of pieces of first image data from over a plurality of heartbeats from the pieces of k-space data over a plurality of heartbeats. The generation function 123c generates a plurality of pieces of k-space data equivalent to full sampling over a plurality of heartbeats through inverse Fourier transform of the pieces of first image data over a plurality of heartbeats, and generates second cardiac time phase information corresponding to pseudo collection times based on the first cardiac time phase information. The second reconstruction function 123d reconstructs a plurality of pieces of second image data corresponding to one heartbeat by performing sorting processing on the pieces of k-space data equivalent to full sampling over a plurality of heartbeats based on the second cardiac time phase information.

Figure 8:
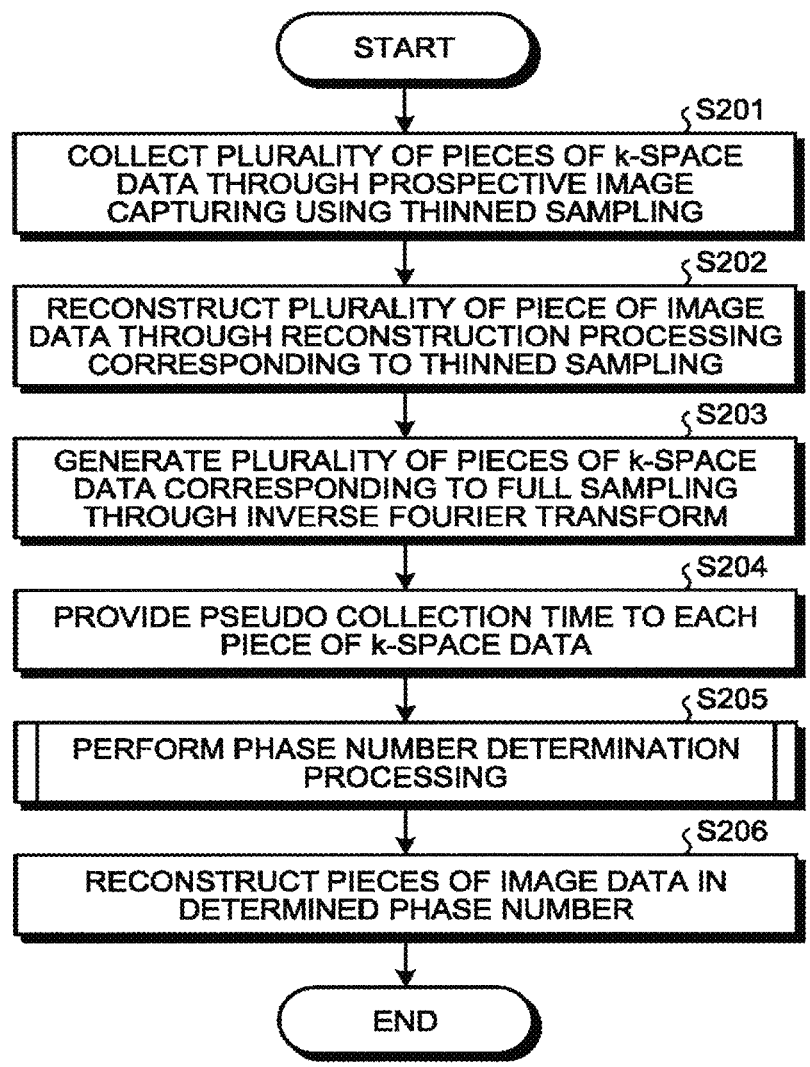
FIG. 8 is a flowchart illustrating a processing procedure executed by an MRI device according to a second embodiment.

The following describes a processing procedure executed by the MRI device 100 according to the second embodiment with reference to FIG. 8. FIG. 8 is a flowchart illustrating the processing procedure executed by the MRI device 100 according to the second embodiment. The processing procedure illustrated in FIG. 8 is started upon, for example, an image capturing start request input by the operator.

At step S201, the acquisition function 123a collects a plurality of pieces of k-space data through prospective image capturing using undersampling. For example, the acquisition function 123a acquires, as the pieces of k-space data, a plurality of pieces of third k-space data included in the first duration starting at a feature point in an electrocardiographic signal and a plurality of pieces of fourth k-space data included in a second duration starting at a time phase different from the feature point.

Figure 9:
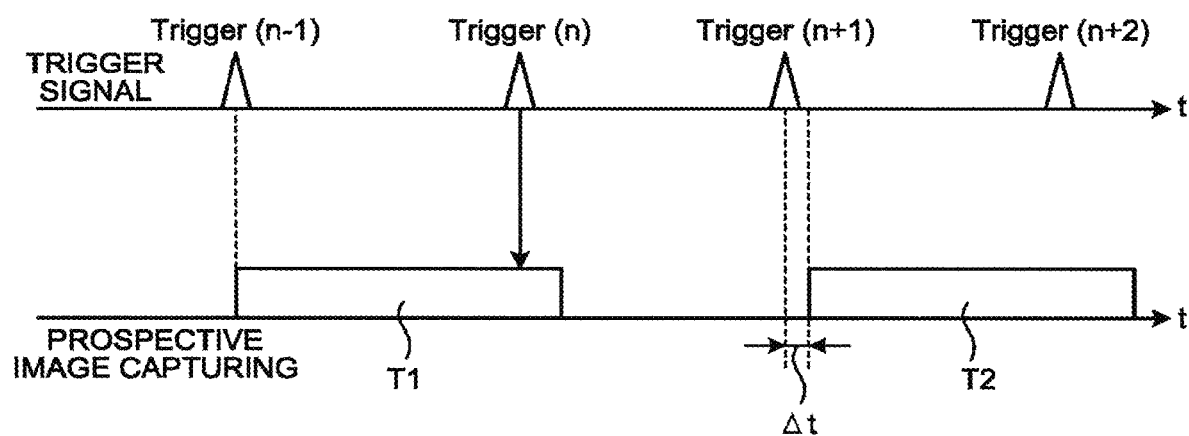
FIG. 9 is a diagram for describing processing of the acquisition function according to the second embodiment.

The following describes processing executed by the acquisition function 123a according to the second embodiment with reference to FIG. 9. FIG. 9 is a diagram for describing the processing executed by the acquisition function 123a according to the second embodiment. In FIG. 9, "t" on the horizontal axis corresponds to the time phase direction. The upper part of FIG. 9 exemplarily illustrates a trigger signal, and the lower part of FIG. 9 exemplarily illustrates an image capturing sequence of prospective image capturing. The trigger signal is an exemplary feature point in an electrocardiographic signal.

As illustrated in FIG. 9, the sequence control circuitry 110 executes prospective image capturing under control of the acquisition function 123a, thereby executing image capturing of an identical slice for one heartbeat by the k-t SENSE in each of durations T1 and T2. Although not illustrated, the sequence control circuitry 110 may execute the image capturing sequence with a dummy shot or the like inserted as appropriate.

The acquisition function 123a performs control to start the duration T1 at the time phase of the trigger signal and start the duration T2 at a time phase different from that of the trigger signal. For example, when having sensed the trigger signal (n) during image capturing in the duration T1, the acquisition function 123a estimates the time of the next trigger signal (n+1) based on the time difference between the previous trigger signal (n−1) and the trigger signal (n). The time of the next trigger signal (n+1) can be estimated because it is known that the durations of two continuous heartbeats are not largely different from each other (have small fluctuation).

Then, the acquisition function 123a inserts a wait time Δt between the time of the trigger signal (n+1) and the starting point of the duration T2 so that image capturing of the duration T2 starts at a time different from the time of the trigger signal (n+1). The wait time Δt can be set to be an optional value input by the operator, but is preferably set to be a value (half pitch) equivalent to half of a pitch width at the phase center of each image. The pitch width at the phase center can be calculated from an image capturing condition.

In this manner, the acquisition function 123a acquires a plurality of pieces of k-space data (third k-space data) included in the duration T1 starting at the time phase of the trigger signal, and acquires a plurality of pieces of k-space data (fourth k-space data) included in the duration T2 starting at a time phase different from that of the trigger signal.

The description continues with reference to FIG. 8. The processing at steps S202 to S204 is basically the same as the processing at steps S102 to S104 except that the processing is executed on the pieces of k-space data collected in the duration T1 and the pieces of k-space data collected in the duration T2.

Specifically, at step S202, the first reconstruction function 123b reconstructs a plurality of piece of image data through reconstruction processing corresponding to the undersampling. Specifically, the first reconstruction function 123b reconstructs a plurality of pieces of image data (third image data) included in the duration T1 based on the pieces of k-space data included in the duration T1. The first reconstruction function 123b also reconstructs a plurality of pieces of image data (fourth image data) included in the duration T2 based on the pieces of k-space data included in the duration T2.

At step S203, the generation function 123c generates a plurality of pieces of k-space data corresponding to full sampling through inverse Fourier transform. Specifically, the generation function 123c generates a plurality of pieces of k-space data (fifth k-space data) equivalent to full sampling included in the duration T1 based on the pieces of image data included in the duration T1. The generation function 123c also generates a plurality of pieces of k-space data (sixth k-space data) equivalent to full sampling included in the duration T2 based on the pieces of image data included in the duration T2.

At step S204, the generation function 123c provides a pseudo collection time to each piece of the k-space data equivalent to full sampling. Specifically, the generation function 123c provides a pseudo collection time to each piece of k-space data equivalent to full sampling included in the duration T1. The generation function 123c also provides a pseudo collection time to each piece of k-space data equivalent to full sampling included in the duration T2.

Figure 10:
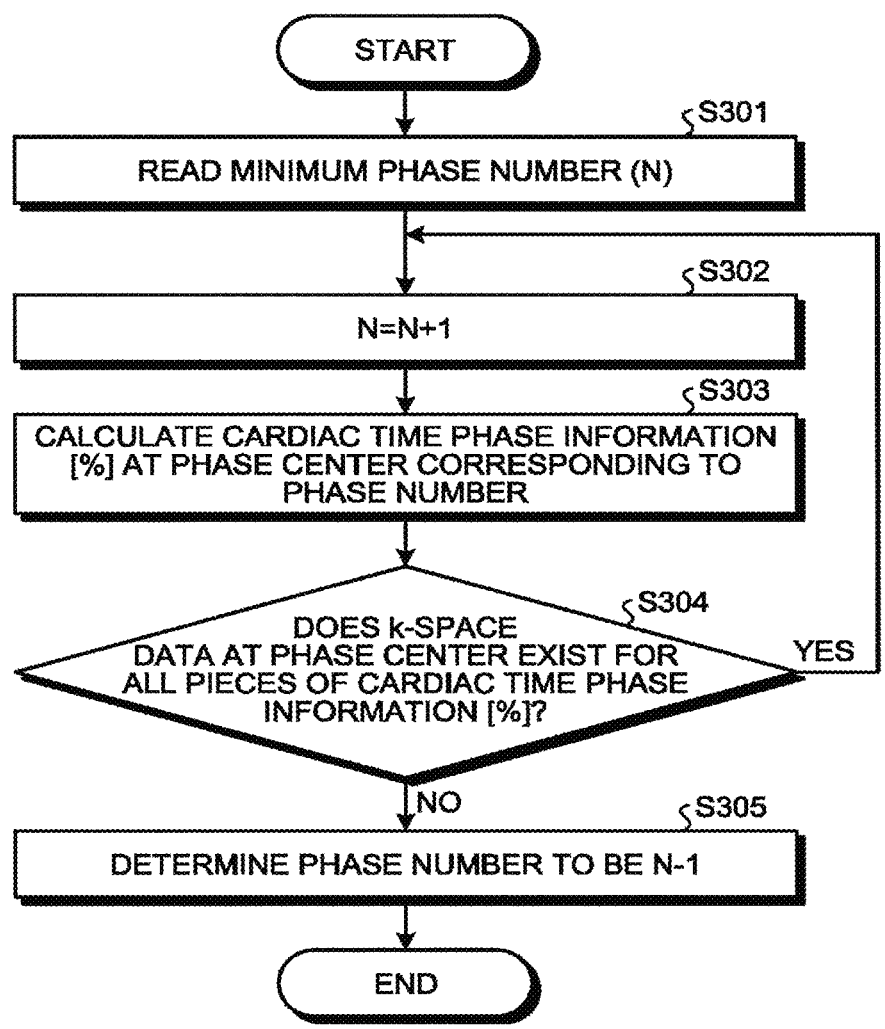
FIG. 10 is a flowchart illustrating the processing procedure of phase number determination processing according to the second embodiment.
Figure 11:
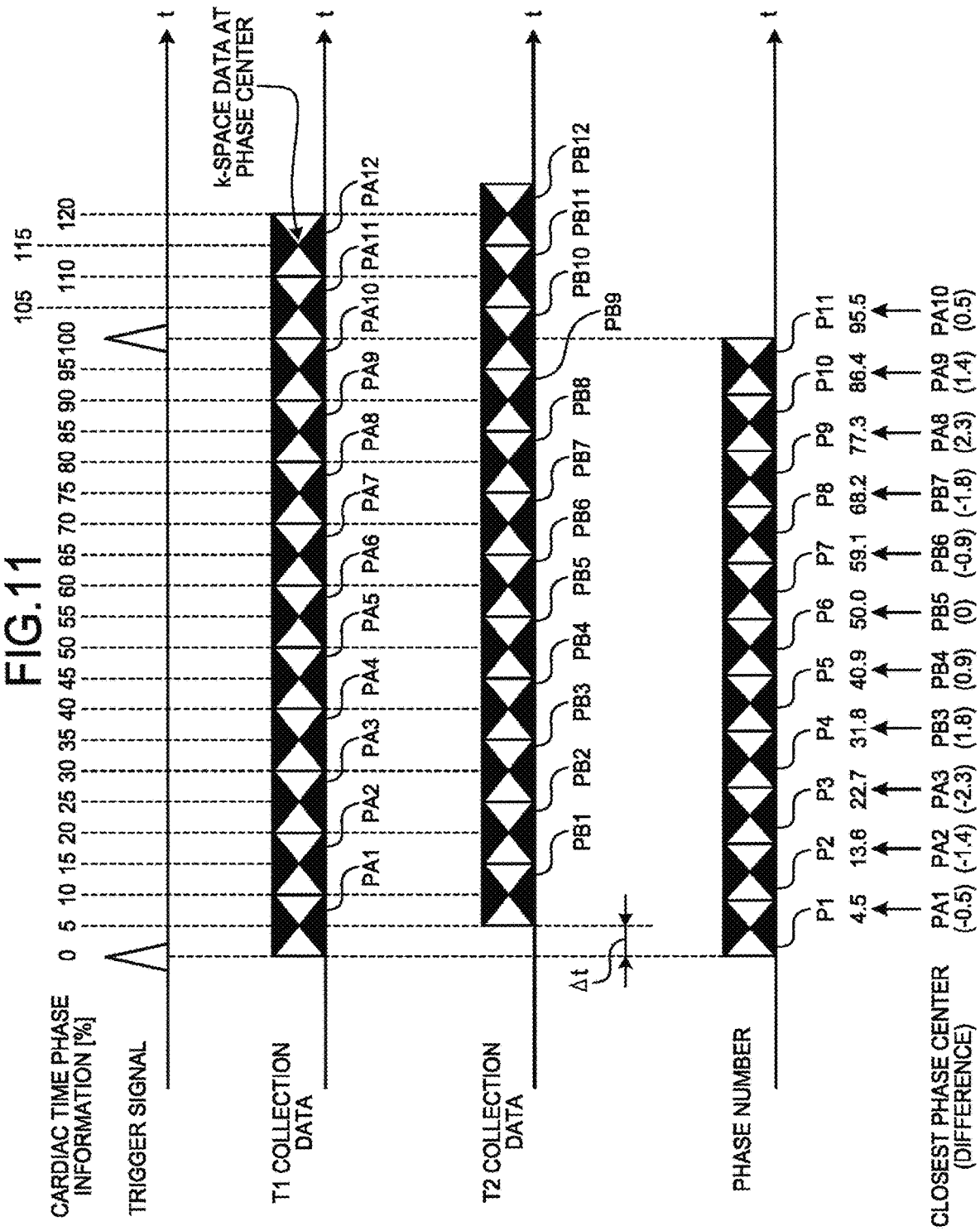
FIG. 11 is a diagram for describing processing of the second reconstruction function according to the second embodiment.

At step S205, the second reconstruction function 123d executes phase number determination processing. The following describes the phase number determination processing executed by the second reconstruction function 123d with reference to FIGS. 10 and 11. FIG. 10 is a flowchart illustrating the processing procedure of the phase number determination processing according to the second embodiment. FIG. 11 is a diagram for describing the processing executed by the second reconstruction function 123d according to the second embodiment.

FIG. 11 illustrates the relation among the trigger signal (at the first part from the top of FIG. 11), collection data of the duration T1 (at the second part from the top in FIG. 11), collection data of the duration T2 (at the third part from the top of FIG. 11), and a determined phase number (at the fourth part from the top of FIG. 11). In FIG. 11, "t" on the horizontal axis corresponds to the time phase direction. Each rectangle corresponding to a time phase (PA1 to PA12, PB1 to PB12, and P1 to P11) is a diagram illustrating the distance between the corresponding piece of k-space data and the phase center. The lateral direction of the rectangle corresponds to the phase encode direction, and the length of the white region in the longitudinal direction corresponds to the distance from the phase center. Thus, the rectangles illustrated in FIG. 11 are same as the rectangles illustrated in FIG. 5. The center of each rectangle corresponds to k-space data at the phase center.

FIG. 11 illustrates a case in which "10" is set as a minimum phase number. The minimum phase number is the minimum number of times of imaging during one heartbeat, and is, for example, specified by the operator when an image capturing condition is set. The minimum phase number is set so that a RR interval is satisfied by 120% approximately with fluctuation of heartbeat taken into account when image capturing for one heartbeat is performed. Thus, the durations T1 and T2 are each set to satisfy the RR interval by 120% approximately. Accordingly, collection substantially equivalent to 12 phases is performed in each of the durations T1 and T2. Specifically, the duration T1 includes 12 phases of the time phases PA1 to PA12, and the duration T2 includes 12 phases of the time phases PB1 to PB12.

At step S301, the second reconstruction function 123d reads the minimum phase number (N). In the example illustrated in FIG. 11, "10" is set as the minimum phase number. Thus, the second reconstruction function 123d reads the minimum phase number of "10" as an initial value.

At step S302, the second reconstruction function 123d increments N by one. Since the read minimum phase number is "10", the second reconstruction function 123d sets "N=11" through "N=10+1". In other words, the second reconstruction function 123d sets the time phases P1, P2, P3, P4, P5, P6, P7, 28, P9, P10, and 211 so that one heartbeat is equally divided into 11 parts (at the fourth part from the top of FIG. 11).

At step S303, the second reconstruction function 123d calculates cardiac time phase information [%] at the phase center of each time phase. The cardiac time phase information indicates the position in one heartbeat in the time phase direction. For example, the cardiac time phase information indicates a position in percentage from the starting point (trigger signal) of the RR interval, at which k-space data is collected when the RR interval is taken to be 100%.

For example, the second reconstruction function 123d calculates the cardiac time phase information at the phase center for each of the time phases PA1 to PA12 included in the duration T1. Specifically, the cardiac time phase information at the phase center for the time phase PA1 is "5%", the cardiac time phase information at the phase center for the time phase PA2 is "15%", the cardiac time phase information at the phase center for the time phase PA3 is "25%", the cardiac time phase information at the phase center for the time phase PA4 is "35%", the cardiac time phase information at the phase center for the time phase PA5 is "45%", the cardiac time phase information at the phase center for the time phase PA6 is "55%", the cardiac time phase information at the phase center for the time phase PA7 is "65%", the cardiac time phase information at the phase center for the time phase PA8 is "75%", the cardiac time phase information at the phase center for the time phase PA9 is "85%", the cardiac time phase information at the phase center for the time phase PA10 is "95%", the cardiac time phase information at the phase center for the time phase PA11 is "105%", and the cardiac time phase information at the phase center for the time phase PA12 is "115%".

The second reconstruction function 123d also calculates the cardiac time phase information at the phase center for each of the time phases PB1 to PB12 included in the duration T2. Specifically, the cardiac time phase information at the phase center for the time phase PB1 is "10%", the cardiac time phase information at the phase center for the time phase PB2 is "20%", the cardiac time phase information at the phase center for the time phase PB3 is "30%", the cardiac time phase information at the phase center for the time phase PB4 is "40%", the cardiac time phase information at the phase center for the time phase PB5 is "50%", the cardiac time phase information at the phase center for the time phase PB6 is "60%", the cardiac time phase information at the phase center for the time phase PB7 is "70%", the cardiac time phase information at the phase center for the time phase PB8 is "80%", the cardiac time phase information at the phase center for the time phase PB9 is "90%", the cardiac time phase information at the phase center for the time phase PB10 is "100%", the cardiac time phase information at the phase center for the time phase PB11 is "110%", and the cardiac time phase information at the phase center for the time phase PB12 is "120%".

The second reconstruction function 123d also calculates the cardiac time phase information [%] at the phase center for each of the time phases P1 to P11 obtained by equally dividing one heartbeat into 11 parts. Specifically, the cardiac time phase information at the phase center for the time phase P1 is "4.5%", the cardiac time phase information at the phase center for the time phase P2 is "13.6%", the cardiac time phase information at the phase center for the time phase P3 is "22.7%", the cardiac time phase information at the phase center for the time phase P4 is "31.8%", the cardiac time phase information at the phase center for the time phase P5 is "40.9%", the cardiac time phase information at the phase center for the time phase P6 is "50.0%", the cardiac time phase information at the phase center for the time phase P7 is "59.1%", the cardiac time phase information at the phase center for the time phase P8 is "68.2%", the cardiac time phase information at the phase center for the time phase P9 is "77.3%", the cardiac time phase information at the phase center for the time phase P10 is "86.4%", and the cardiac time phase information at the phase center for the time phase P11 is "95.5%".

At step S304, the second reconstruction function 123d determines whether k-space data at the phase center exists for all pieces of the cardiac time phase information [%]. For example, the second reconstruction function 123d determines whether the cardiac time phase information at the phase center for the time phases PA1 to PA12 and PB1 to PB12 exists within a predetermined threshold from the cardiac time phase information at the phase center for each of the time phases P1 to P11. In this example, the threshold is "2.4".

As illustrated in FIG. 11, the cardiac time phase information of "5%" at the phase center for the time phase PA1 is closest to the cardiac time phase information of "4.5%" at the phase center for the time phase P1, and the difference therebetween is "−0.5". The cardiac time phase information of "15%" at the phase center for the time phase PA2 is closest to the cardiac time phase information of "13.6%" at the phase center for the time phase P2, and the difference therebetween is "−1.4". The cardiac time phase information of "25%" at the phase center for the time phase PA3 is closest to the cardiac time phase information of "22.7%" at the phase center for the time phase P3, and the difference therebetween is "−2.3". The cardiac time phase information of "30%" at the phase center for the time phase PB3 is closest to the cardiac time phase information of "31.8%" at the phase center for the time phase P4, and the difference therebetween is "1.8". The cardiac time phase information of "40%" at the phase center for the time phase PB4 is closest to the cardiac time phase information of "40.9%" at the phase center for the time phase P5, and the difference therebetween is "0.9". The cardiac time phase information of "50%" at the phase center for the time phase PB5 is closest to the cardiac time phase information of "50.0%" at the phase center for the time phase P6, and the difference therebetween is "0". The cardiac time phase information of "60%" at the phase center for the time phase PB6 is closest to the cardiac time phase information of "59.1%" at the phase center for the time phase P7, and the difference therebetween is "−0.9". The cardiac time phase information of "70%" at the phase center for the time phase PB7 is closest to the cardiac time phase information of "68.2%" at the phase center for the time phase P8, and the difference therebetween is "−1.8". The cardiac time phase information of "75%" at the phase center for the time phase PA8 is closest to the cardiac time phase information of "77.3%" at the phase center for the time phase P9, and the difference therebetween is "2.3". The cardiac time phase information of "85%" at the phase center for the time phase PA9 is closest to the cardiac time phase information of "86.4%" at the phase center for the time phase P10, and the difference therebetween is "1.4". The cardiac time phase information of "95%" at the phase center for the time phase PA10 is closest to the cardiac time phase information of "95.5%" at the phase center for the time phase P11, and the difference therebetween is "0.5".

The difference (absolute value) between any of the time phases P1 to P11 and the closest cardiac time phase information is smaller than the threshold of "2.4". In this case, the second reconstruction function 123d determines that the k-space data at the phase center exists for the cardiac time phase information [%] of all time phases (Yes at step S304), and proceeds to step S302. In this manner, the second reconstruction function 123d determines whether the k-space data at the phase center exists in the increased phase number for each time the phase number is increased by one.

When the difference between any of the time phases P1 to P11 and the closest cardiac time phase information exceeds the threshold of "2.4", the second reconstruction function 123d determines that the k-space data at the phase center does not exist for the cardiac time phase information [%] of all time phases (No at step S304), and proceeds to step S305.

At step S305, the second reconstruction function 123d determines the phase number to be N−1. Specifically, the second reconstruction function 123d determines the phase number to be a maximum value among phase numbers for which it is determined that the k-space data at the phase center exists for the cardiac time phase information [%] of all time phases.

The description continues with reference to FIG. 8. At step S206, the second reconstruction function 123d reconstructs pieces of image data in the determined phase number. In this case, the second reconstruction function 123d extracts a plurality of pieces of k-space data corresponding to the determined phase number from a plurality of pieces of k-space data included in the durations T1 and T2. Then, the second reconstruction function 123d sorts the extracted pieces of k-space data corresponding to time phases so that the pieces of k-space data match the phase encode pattern of a single image. Then, the second reconstruction function 123d reconstructs image data of each time phase by using the sorted pieces of k-space data corresponding to the time phases.

Figure 12:
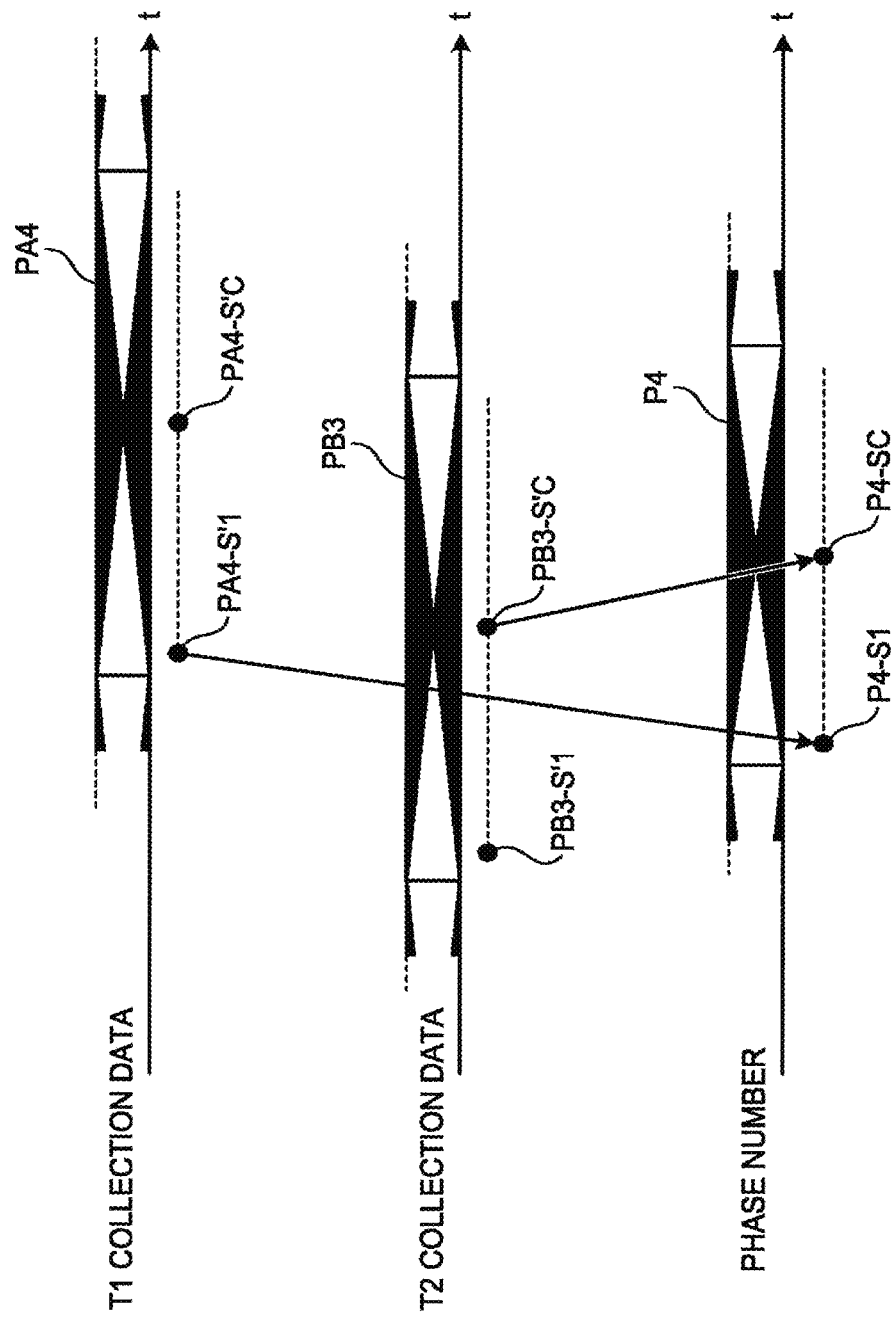
FIG. 12 is a diagram for describing processing of the second reconstruction function according to the second embodiment.

The following describes the processing of extracting a plurality of pieces of k-space data corresponding to the determined phase number with reference to FIG. 12. FIG. 12 is a diagram for describing processing executed by the second reconstruction function 123d according to the second embodiment. FIG. 12 illustrates enlarged views of the vicinities of the time phase P4, the time phase PA4, and the time phase PB3 in FIG. 11. In FIG. 12, each black circle represents k-space data.

FIG. 12 indicates the processing of extracting a plurality of pieces of k-space data corresponding to the time phase P4 from k-space data included in the time phases PA4 and PB3. The second reconstruction function 123d extracts, from the k-space data included in the time phases PA4 and PB3, k-space data having a phase encode amount identical to that of the k-space data disposed in the time phase P4 and having cardiac time phase information [%] close to that of the k-space data.

The k-space data P4-SC of the time phase P4 is positioned at the center (phase center) of the time phase P4 in the phase encode direction. The k-space data PA4-S'C and the k-space data PB3-S'C each have a phase encode amount identical to that of the k-space data P4-SC. The k-space data PB3-S'C has cardiac time phase information [%] close to that of the k-space data P4-SC. Thus, the second reconstruction function 123d extracts the k-space data PB3-S'C from the collection data of the duration T2, and disposes the k-space data PB3-S'C at the position of the k-space data P4-S1.

The k-space data P4-S1 of the time phase P4 is positioned at an end part of the time phase P4 in the phase encode direction. The k-space data PA4-S'1 and the k-space data PB3-S'1 each have a phase encode amount identical to that of the k-space data P4-S1. The k-space data PAB4-S'1 has cardiac time phase information [%] close to that of the k-space data P4-S1. Thus, the second reconstruction function 123d extracts the k-space data PA4-S'1 from the collection data of the duration T1, and disposes the k-space data PA4-S'1 at the position of the k-space data P4-S1.

In this manner, the second reconstruction function 123d extracts k-space data disposed in each time phase corresponding to the determined phase number from the k-space data included in the time phases PA4 and PB3. Then, the second reconstruction function 123d sorts the extracted k-space data so that the k-space data matches the phase encode pattern of a single image and performs reconstruction. Thereafter, the output control function 123e displays reconstructed image data as appropriate.

As described above, the MRI device 100 according to the second embodiment collects k-space data over a plurality of heartbeats through prospective image capturing using undersampling. Then, the MRI device 100 reconstructs image data over a plurality of heartbeats through reconstruction processing corresponding to the undersampling. Then, the MRI device 100 generates k-space data equivalent to full sampling over a plurality of heartbeats through inverse Fourier transform. Then, the MRI device 100 determines a phase number for improved time resolution based on whether the k-space data equivalent to full sampling exists within the predetermined threshold from the cardiac time phase information at the phase center for each time phase. Then, the MRI device 100 reconstructs pieces of image data in the determined phase number from the k-space data equivalent to full sampling over a plurality of heartbeats. Accordingly, the MRI device 100 can improve the time resolution by using the k-space data over a plurality of heartbeats collected through the prospective image capturing.

Typically, in prospective image capturing, the starting point of image capturing is synchronized in accordance with a trigger signal to align the cardiac time phase of each image data between a plurality of heartbeats. However, the MRI device 100 according to the second embodiment intentionally shifts the cardiac time phase of each image data between a plurality of heartbeats by providing the wait time Δt to one collection duration while performing prospective image capturing. This diversifies the collected cardiac time phase information at the phase center for each time phase, which improves the time resolution.

The second embodiment exemplarily describes the processing of increasing the phase number one by one to increase the time resolution, but is not limited thereto. For example, input of a phase number desired by the operator may be received, and the determination at step S304 may be performed for the received phase number.

Modification of Second Embodiment

The second embodiment describes the case in which the cardiac time phase of each image data is intentionally shifted between a plurality of heartbeats by providing the wait time Δt to one collection duration when k-space data is collected over the heartbeats. However, the embodiments are not limited thereto.

For example, it is known that the durations of two continuous heartbeats are slightly different (fluctuate) for a healthy subject. The fluctuation can be used to diversify collected cardiac time phase information at the phase center for each time phase.

Figure 13:
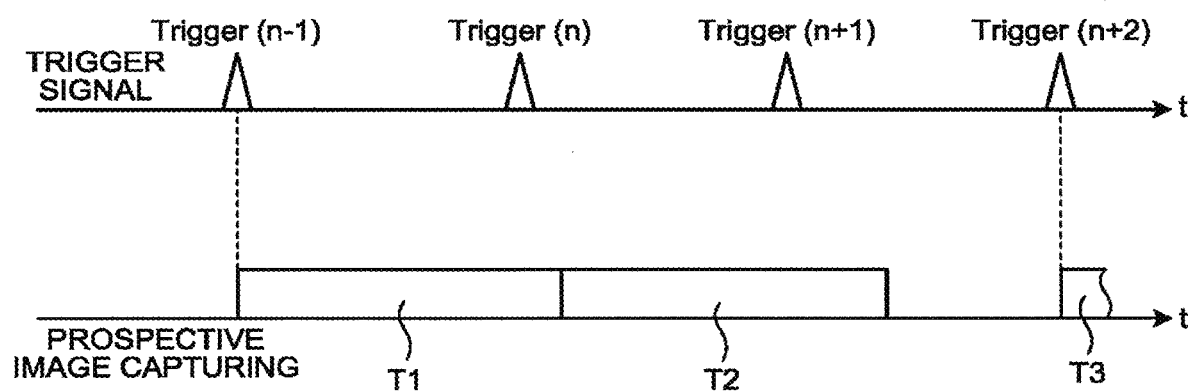
FIG. 13 is a diagram for describing processing of the acquisition function according to a modification of the second embodiment.

The following describes processing executed by the acquisition function 123a according to a modification of the second embodiment with reference to FIG. 13. FIG. 13 is a diagram for describing the processing executed by the acquisition function 123a according to the modification of the second embodiment. In FIG. 13, "t" on the horizontal axis corresponds to the time phase direction. The upper part of FIG. 13 exemplarily illustrates a trigger signal, and the lower part of FIG. 13 exemplarily illustrates an image capturing sequence of prospective image capturing.

As illustrated in FIG. 13, the sequence control circuitry 110 executes prospective image capturing under control of the acquisition function 123a, thereby executing continuous image capturing of the durations T1 and T2. In this manner, when the continuous image capturing is performed without providing the wait time Δt, the cardiac time phase of image data can be shifted in the durations T1 and T2 by using the fluctuation between the durations of two continuous heartbeats.

OTHER EMBODIMENTS

The present disclosure may be performed in various kinds of different forms other than the above-described embodiments.

(Use of x-f Space Data as Intermediate Data)

In the above-described embodiments, when k-space data corresponding to full sampling is generated, the k-space data is temporarily converted (reconstructed) into image data as intermediate data, but the embodiments are not limited thereto. Thus, the MRI device 100 can generate k-space data corresponding to full sampling without conversion into image data.

For example, the first reconstruction function 123b executes reconstruction processing corresponding to the k-t SENSE on k-space data of a plurality of time phases acquired by the acquisition function 123a. Through this process, the first reconstruction function 123b generates x-f space data from which an alias signal is removed as described above. The x-f space data is intermediate data before being converted into image data (real space data).

The first reconstruction function 123b according to another embodiment performs processing including Fourier transform (inverse Fourier transform) on the x-f space data. Accordingly, the first reconstruction function 123b can generate k-space data corresponding to full sampling from the k-space data of a plurality of time phases acquired by the acquisition function 123a. In other words, the first reconstruction function 123b generates intermediate data by converting data including the first k-space data and the second k-space data. Then, the first reconstruction function 123b generates, by inversely converting the intermediate data, third k-space data and fourth k-space data that correspond to the first k-space data and the second k-space data, respectively, and in each of which at least part of a region undersampled through the corresponding undersampled pattern is filled.

The first reconstruction function 123b performs the above-described processing of generating a plurality of pieces of k-space data corresponding to full sampling in place of the processing at steps S102 and S103. The contents of the processing at step S104 and later are same as those described with reference to FIG. 2, and description thereof will be omitted.

In k-space data generated through processing including Fourier transform, not all of a plurality of pieces of k-space data corresponding to full sampling necessarily need to be filled. For example, it is sufficient to reproduce a sampling pattern that allows k-t reconstruction. As an example, the k-space data generated through processing including Fourier transform may be a plurality of pieces of k-space data corresponding to simple undersampling. Specifically, the first reconstruction function 123b inversely converts intermediate data obtained by converting a plurality of pieces of k-space data, thereby generating, from the pieces of k-space data, a plurality of pieces of k-space data in which at least part of an undersampled region for full sampling is filled.

Excess Data Removal

In the k-t SENSE, since reconstruction processing is performed in units of blocks, excess data is collected in some cases, depending on an acquisition number set by the operator. In such a case, the MRI device 100 can reduce generation of artifact by performing retrospective reconstruction after removing the excess data.

Each "block" means a group of pieces of k-space data in a time phase number defined in reconstruction processing in the k-t SENSE. For example, when the undersampling rate in the k-t SENSE is "4", each block includes k-space data of four time phases.

Figure 14:
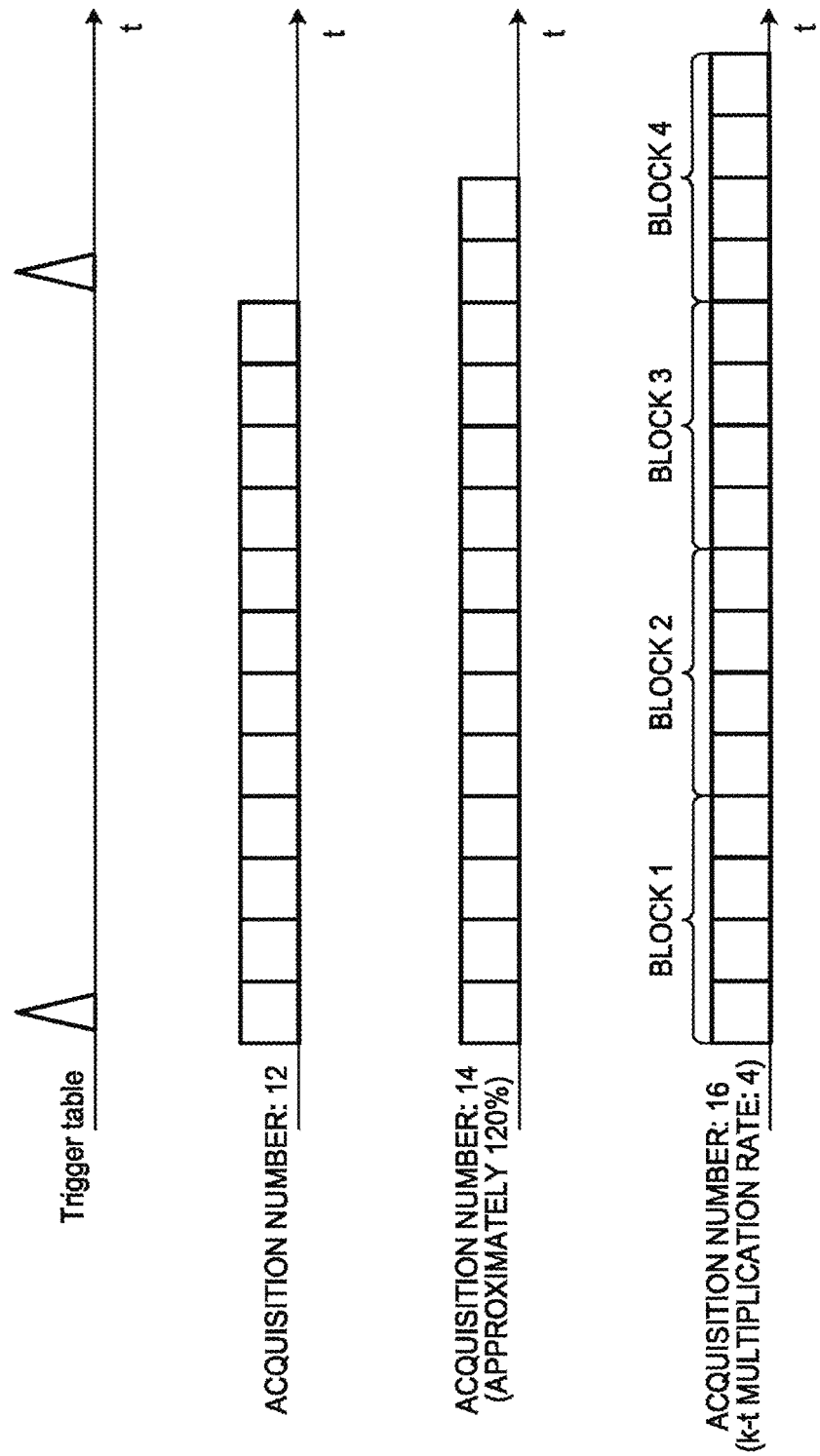
FIG. 14 is a diagram for describing processing performed by the MRI device according to another embodiment.

FIGS. 14 and 15 are each a diagram for describing processing performed by the MRI device 100 according to another embodiment. In FIGS. 14 and 15, the lateral direction corresponds to elapsed time. Each rectangle illustrated in FIG. 14 corresponds to a group of pieces of k-space data (for one MR image) included in a time phase. Each rectangle illustrated in the first to third parts from the top of FIG. 15 corresponds to a group of a plurality of pieces of k-space data included in a time phase. Each rectangle illustrated in the fourth part from the top of FIG. 15 corresponds to an MR image of a time phase.

As illustrated in FIG. 14, since a time phase number corresponding to 120% approximately is "14" when the acquisition number of "12" is set by the operator, "2" time phases are desirably added. However, since reconstruction processing is performed in the units of blocks in the k-t SENSE, the addition is performed in the units of blocks.

For example, when the undersampling rate in the k-t SENSE is "4", Block 4 is added to Blocks 1 to 3 corresponding to the acquisition number of "12".

Accordingly, as illustrated in FIG. 15, the acquisition function 123a collects k-space data of 16 time phases corresponding to Blocks 1 to 4 (S11). Then, the first reconstruction function 123b performs full sampling to generate a plurality of pieces of fully sampled k-space data (S12). The k-space data of the fifteenth and sixteenth time phases is excess data for the time phase number of "14" corresponding to 120% of the acquisition number. Thus, the generation function 123c removes k-space data to remove the k-space data of the fifteenth and sixteenth time phases, and selects a plurality of pieces of k-space data corresponding to approximately 120% (S13). Then, the second reconstruction function 123d generates a reconstruction image corresponding to the acquisition number of "12" by performing retrospective reconstruction for the pieces of fully sampled k-space data of the first time phase to the fourteenth time phase (S14). In this manner, the MRI device 100 can reduce generation of artifact.

As described above, the second reconstruction function 123d generates an MR image after removing k-space data of any excess time phase from among the generated k-space data equivalent to full sampling.

The reconstruction image of the first time phase at S14 is reconstructed by combining the k-space data of the first time phase and the k-space data of the thirteenth time phase at S13 (for example, by using half of each k-space data). The k-space data of the first time phase and the k-space data of the thirteenth time phase at S13 are cardiac time phase data substantially identical to each other, but motion of the heart is not completely identical therebetween. Thus, the reconstruction image of the first time phase corresponds to an average of motion of the heart in the first time phase and motion of the heart in the thirteenth time phase. For this reason, the reconstruction image of the first time phase preferably stores, as accompanying information, information (such as a label) indicating that the image is reconstructed by using k-space data of a plurality of time phases. For the same reason, the reconstruction image of the second time phase preferably stores, as accompanying information, information indicating that the image is reconstructed by using k-space data of a plurality of time phases. Accordingly, the operator can recognize a reconstruction image reconstructed by using k-space data of a plurality of time phases.

Removal Determination Based on Actual RR Interval

Although FIGS. 14 and 15 illustrate the processing of removing excess data, the processing does not necessarily need to be executed.

For example, an image capturing condition sets (defines) in advance the duration (RR interval) of one cardiac cycle suitable for the subject. When the RR interval at actual scanning is longer than the duration of one cardiac cycle defined in advance, the k-space data of the fifteenth and sixteenth time phases in FIG. 15 is not excess data but is necessary data. Thus, the MRI device 100 may omit the processing of removing excess data when the RR interval at actual scanning is longer than the duration of one cardiac cycle defined in advance.

FIG. 16 is a diagram for describing processing performed by the MRI device 100 according to another embodiment. In FIG. 16, the lateral direction corresponds to elapsed time. In FIG. 16, the duration (RR interval) of one cardiac cycle suitable for the subject is set to be "800 msec".

Specifically, as illustrated in FIG. 16, the acquisition function 123a collects k-space data of 16 time phases corresponding to Blocks 1 to 4 (S21). Then, the first reconstruction function 123b performs full sampling to generate a plurality of pieces of fully sampled k-space data (S22). The k-space data of the fifteenth and sixteenth time phases is excess data for the time phase number of "14" corresponding to 120% of the acquisition number. S21 and S22 in FIG. 16 are same as S11 and S12 in FIG. 15.

It is known that the RR interval fluctuates (varies) even for a healthy subject in actual scanning. Thus, the generation function 123c acquires the actual RR interval, and determines whether to remove the k-space data of the fifteenth and sixteenth time phases based on the actual RR interval (S23). For example, the generation function 123c compares the RR interval of the k-space data collected at S21 with the RR interval of "800 msec" set by the operator.

For example, a case where the actual RR interval is "780 msec" is described. In this case, the actual RR interval of "780 msec" is shorter than the RR interval of "800 msec" set by the operator. Thus, the generation function 123c removes k-space data to remove the k-space data of the fifteenth and sixteenth time phases, and selects a plurality of pieces of k-space data corresponding to approximately 120%. Then, the second reconstruction function 123d generates a reconstruction image corresponding to the acquisition number of "12" by performing retrospective reconstruction for the pieces of fully sampled k-space data of the first time phase to the fourteenth time phase. Processing when the removal is determined is the same as the processing at S13 and S14 in FIG. 15.

For example, a case where the actual RR interval is "850 msec" is described. In this case, the actual RR interval of "850 msec" is longer than the RR interval of "800 msec" set by the operator. Thus, the second reconstruction function 123d generates a reconstruction image corresponding to the acquisition number of "12" by performing retrospective reconstruction for the pieces of fully sampled k-space data of the first time phase to the sixteenth time phase.

In this manner, the second reconstruction function 123d determines whether to perform the processing of removing k-space data of any excess time phase based on the actual RR interval. Accordingly, the MRI device 100 can select data of an appropriate time phase in accordance with the actual RR interval and perform reconstruction.

In FIG. 16, the comparison is performed by using the RR interval of "800 msec" set by the operator as a threshold, but the embodiments are not limited thereto. For example, the RR interval as a threshold may be set to be a value different from the RR interval set by the operator. However, the threshold is preferably set based on the RR interval set by the operator.

Medical Image Processing Apparatus

For example, in the above-described embodiments, the processing functions of the acquisition function 123a, the first reconstruction function 123b, the generation function 123c, the second reconstruction function 123d, and the output control function 123e as components of the processing circuitry 123 are executed by the MRI device 100, but the embodiments are not limited thereto. For example, the above-described processing functions may be executed by a medical image processing apparatus such as a work station.

Figure 17:
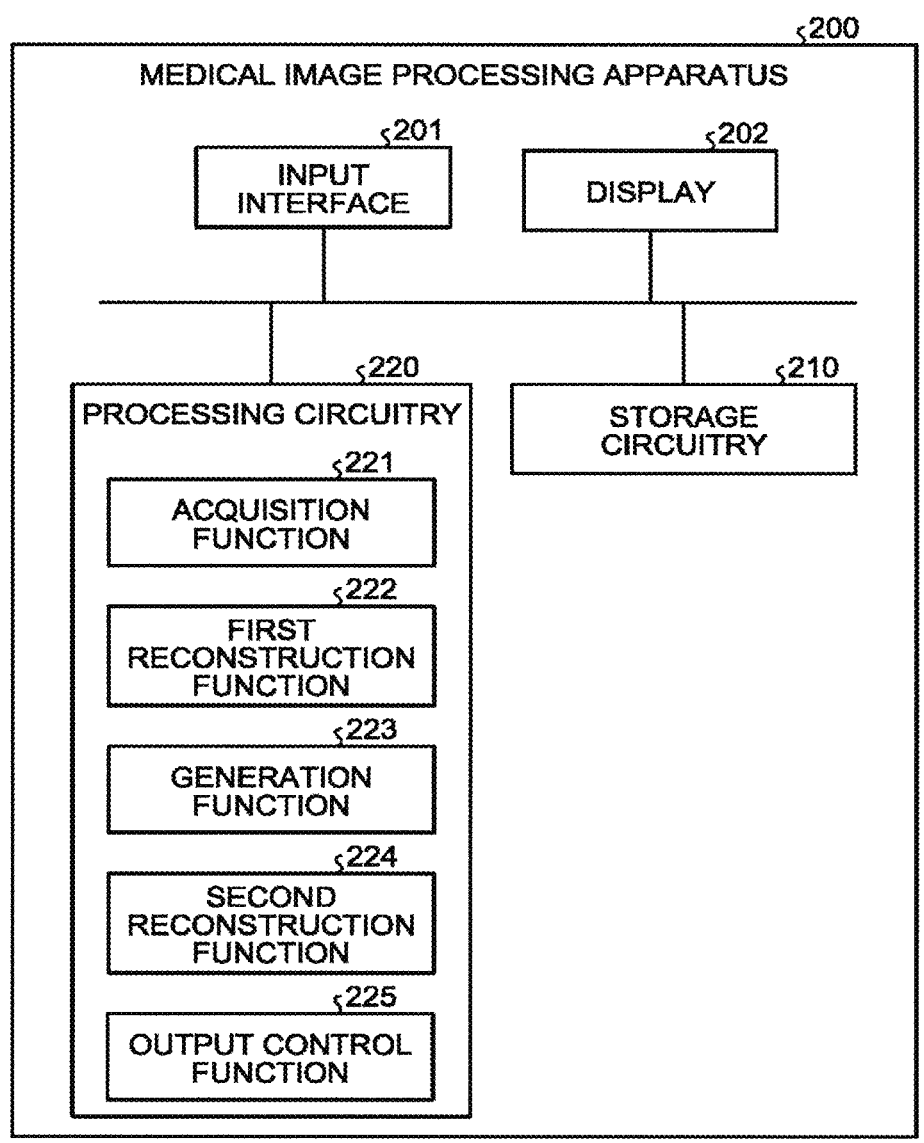
FIG. 17 is a block diagram illustrating a medical image processing apparatus according to another embodiment.

FIG. 17 is a block diagram illustrating a medical image processing apparatus 200 according to another embodiment. The medical image processing apparatus 200 corresponds to an information processing device such as a personal computer or a work station.

As illustrated in FIG. 17, the medical image processing apparatus 200 includes an input interface 201, a display 202, a storage circuitry 210, and a processing circuitry 220. The input interface 201, the display 202, the storage circuitry 210, and the processing circuitry 220 are connected with each other to mutually perform communication therebetween.

The input interface 201 is an input device such as a mouse, a keyboard, or a touch panel for receiving various instructions and setting requests from the operator. The display 202 is a display device configured to display a medical image and a GUI that allows the operator to input various setting requests by using the input interface 201.

The storage circuitry 210 is, for example, a NAND (Not AND) flash memory or a hard disk drive (HDD) configured to store various computer programs displaying medical image data and a GUI, and information used by the computer programs. In the present embodiment, the storage circuitry 210 stores in advance, for example, information in which a plurality of pieces of k-space data collected through undersampling are associated with the collection times of the pieces of k-space data.

The processing circuitry 220 is an electronic device (processor) configured to control entire processing at the medical image processing apparatus 200. The processing circuitry 220 executes an acquisition function 221, a first reconstruction function 222, a generation function 223, a second reconstruction function 224, and an output control function 225. Each processing function executed by the processing circuitry 220 is recorded in the storage circuitry 210, for example, in the form of a computer-executable computer program. The processing circuitry 220 reads and executes each computer program to achieve a function corresponding to the read computer program. The acquisition function 221, the first reconstruction function 222, the generation function 223, the second reconstruction function 224, and the output control function 225 can execute processes basically the same as those of the acquisition function 123a, the first reconstruction function 123b, the generation function 123c, the second reconstruction function 123d, and the output control function 123e illustrated in FIG. 1.

Specifically, in the medical image processing apparatus 200, the acquisition function 221 acquires a plurality of pieces of k-space data at a plurality of collection times provided with undersampling through, for example, the Cartesian collection or the radial collection. The first reconstruction function 222 reconstructs first image data from the k-space data through reconstruction processing corresponding to the undersampling. The generation function 223 generates a plurality of pieces of k-space data corresponding to full sampling through inverse Fourier transform of the first image data, and generates a pseudo collection time of each piece of generated k-space data. The second reconstruction function 224 performs sorting processing on the k-space data based on the pseudo collection time, and reconstructs second image data by using the k-space data after the sorting processing. Accordingly, the medical image processing apparatus 200 can perform imaging at a desired time resolution.

When the processing according to the second embodiment is to be executed by the medical image processing apparatus 200, information of a trigger signal is preferably stored in the storage circuitry 210.

Each illustrated device component is functionally conceptual, and does not necessarily need to be physically configured as illustrated. In other words, specific forms of distribution and integration of each device are not limited to those illustrated, and all or part thereof may be functionally or physically distributed and integrated in optional units in accordance with, for example, various loads and use statuses. Moreover, all or an optional part of each processing function performed by each device may be achieved by a CPU and a computer program analyzed and executed by the CPU, or may be achieved as wired logic hardware.

Among the pieces of processing described above in the embodiments and modifications, all or part of processing described as being automatically performed may be manually performed, or all or part of processing described as being manually performed may be automatically performed by a well-known method. In addition, information including procedures, control procedures, specific names, various kinds of data and parameters of processing described in the above-described document and drawings may be optionally changed unless otherwise stated.

The image reconstruction method described above in the embodiments and modifications may be achieved by a computer such as a personal computer or a work station executing an image reconstruction program prepared in advance. The image reconstruction program may be distributed through a network such as the Internet. The image reconstruction program may be recorded in a computer-readable recording medium such as a hard disk, a flexible disk (FD), a CD-ROM, an MO, or a DVD, and read from the recording medium and executed by a computer.

According to at least one of the above-described embodiments, imaging can be performed at a desired time resolution.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image reconstruction method comprising:
   collecting first k-space data at a first collection time and second k-space data having an undersampled pattern different from an undersampled pattern of the first k-space data at a second collection time different from the first collection time;
   generating a first magnetic resonance (MR) image or x-f space data by converting data including the first k-space data and the second k-space data;
   generating, by inversely converting the first MR image or the x-f space data, third k-space data and fourth k-space data that correspond to the first k-space data and the second k-space data, respectively, and in each of which at least part of a region undersampled through the corresponding undersampled pattern is filled; and
   generating a second magnetic resonance (MR) image at a time different from any of the first collection time and the second collection time by converting k-space data obtained by combining at least part of the third k-space data and at least part of the fourth k-space data.

2. The image reconstruction method according to claim 1, wherein a line different from a filled line of the first k-space data in a phase encode direction is filled in the second k-space data.

3. The image reconstruction method according to claim 1, wherein in the generating the second MR image, the second MR image is generated by performing view sharing processing by using at least part of the third k-space data and at least part of the fourth k-space data.

4. The image reconstruction method according to claim 1, wherein in the generating the second MR image, the second MR image is generated after k-space data of any excess time phase is removed from the generated third k-space data and the generated fourth k-space data.

5. The image reconstruction method according to claim 4, wherein in the generating the second MR image, whether to perform processing of removing the k-space data of the excess time phase is determined based on an actual RR interval.

6. The image reconstruction method according to claim 1, wherein in the generating the second MR image, the second MR images in a number specified by an operator are reconstructed.

7. The image reconstruction method according to claim 1, wherein:
generating the first magnetic resonance (MR) image or the x-f space data by converting data including the first k-space data and the second k-space data is performed by generating the first magnetic resonance (MR) image by converting data including the first k-space data and the second k-space data; and
generating, by inversely converting the first MR image or the x-f space data, the third k-space data and the fourth k-space data is filled is performed by generating, by inversely converting the first MR image, the third k-space data and the fourth k-space data that correspond to the first k-space data and the second k-space data, respectively, and in each of which at least part of a region undersampled through the corresponding undersampled pattern is filled.

8. The image reconstruction method according to claim 1, wherein:
generating the first magnetic resonance (MR) image or the x-f space data by converting data including the first k-space data and the second k-space data is performed by generating the x-f space data by converting data including the first k-space data and the second k-space data; and
generating, by inversely converting the first MR image or the x-f space data, the third k-space data and the fourth k-space data is filled is performed by generating, by inversely converting the x-f space data, the third k-space data and the fourth k-space data that correspond to the first k-space data and the second k-space data, respectively, and in each of which at least part of a region undersampled through the corresponding undersampled pattern is filled.

9. An image reconstruction method comprising:
collecting, by undersampling, a plurality of pieces of first k-space data over a plurality of heartbeats in accordance with detection of a feature point in an electrocardiographic signal of a subject, and collecting first collection times at which the respective pieces of first k-space data are collected;
generating a first magnetic resonance (MR) image or x-f space data by converting the pieces of first k-space data;
generating, by inversely converting the first MR image or the x-f space data, a plurality of pieces of second k-space data in which at least part of a region undersampled through the undersampling is filled;
generating pseudo second collection times of the respective pieces of second k-space data based on the first collection times; and
reconstructing a plurality of second magnetic resonance (MR) images corresponding to one heartbeat by performing sorting processing on the pieces of second k-space data over a plurality of heartbeats based on the second collection times.

10. The image reconstruction method according to claim 9, wherein
in the collecting, the pieces of first k-space data are collected separately in a first duration starting at a feature point in the electrocardiographic signal, and a second duration starting at a cardiac time phase different from the feature point,
in the generating the first MR image or the x-f space data, the first MR image or the x-f space data is generated for each of the first duration and the second duration,
in the generating the second k-space data, the pieces of second k-space data are generated for each of the first duration and the second duration,
in the generating the second collection times, the second collection times are generated for each of the first duration and the second duration, and
in the reconstructing, the second MR images having high time resolution and corresponding to one heartbeat are reconstructed by using the pieces of second k-space data generated for each of the first duration and the second duration.

11. The image reconstruction method according to claim 9, wherein
generating the first magnetic resonance (MR) image or the x-f space data by converting the pieces of first k-space data is performed by generating the first magnetic resonance (MR) image by converting the pieces of first k-space data; and
generating, by inversely converting the first MR image or the x-f space data, the plurality of pieces of second k-space data is performed by generating, by inversely converting the first MR image or the x-f space data, a plurality of pieces of second k-space data in which at least part of a region undersampled through the undersampling is filled.

12. The image reconstruction method according to claim 9, wherein
generating the first magnetic resonance (MR) image or the x-f space data by converting the pieces of first k-space data is performed by generating the x-f space data by converting the pieces of first k-space data; and
generating, by inversely converting the first MR image or the x-f space data, the plurality of pieces of second k-space data is performed by generating, by inversely converting the x-f space data, the plurality of pieces of second k-space data in which at least part of a region undersampled through the undersampling is filled.

* * * * *